United States Patent
Basu et al.

(10) Patent No.: US 9,231,094 B2
(45) Date of Patent: Jan. 5, 2016

(54) ELEMENTAL SEMICONDUCTOR MATERIAL CONTACT FOR HIGH ELECTRON MOBILITY TRANSISTOR

(71) Applicant: GLOBALFOUNDRIES INC., Grand Cayman (KY)

(72) Inventors: Anirban Basu, Elmsford, NY (US); Bahman Hekmatshoartabari, White Plains, NY (US); Davood Shahrjerdi, White Plains, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 13/898,585

(22) Filed: May 21, 2013

(65) Prior Publication Data

US 2014/0346567 A1 Nov. 27, 2014

(51) Int. Cl.
| | |
|---|---|
| *H01L 29/778* | (2006.01) |
| *H01L 29/66* | (2006.01) |
| *H01L 21/283* | (2006.01) |
| *H01L 21/027* | (2006.01) |
| *H01L 21/311* | (2006.01) |

(52) U.S. Cl.
CPC ........ *H01L 29/7786* (2013.01); *H01L 21/0272* (2013.01); *H01L 21/283* (2013.01); *H01L 21/31144* (2013.01); *H01L 29/66431* (2013.01); *H01L 29/66462* (2013.01)

(58) Field of Classification Search
CPC .............................. H01L 29/778; H01L 29/66
USPC .......................................... 257/194; 438/172
See application file for complete search history.

(56) References Cited

U.S. PATENT DOCUMENTS

| | | | |
|---|---|---|---|
| 5,523,587 | A | 6/1996 | Kwo |
| 6,680,485 | B1 | 1/2004 | Carey et al. |
| 7,238,560 | B2 | 7/2007 | Sheppard et al. |
| 7,638,818 | B2 | 12/2009 | Wu et al. |

(Continued)

FOREIGN PATENT DOCUMENTS

| | | |
|---|---|---|
| CN | 101710590 B | 12/2011 |
| CN | 102148154 B | 10/2012 |

OTHER PUBLICATIONS

Office Action dated Sep. 30, 2014 received in U.S. Appl. No. 13/898,580.
Mohammed, F.M. et al., "Si-induced enhancement of ohmic performance of Ti/Al/Mo/Au metallisation for AlGaN/GaN HEMTs" Electronic Letters (Aug. 18, 2005) 2 pages, vol. 41, No. 17.

(Continued)

*Primary Examiner* — Asok K Sarkar
*Assistant Examiner* — Dmitriy Yemelyanov
(74) *Attorney, Agent, or Firm* — Scully, Scott, Murphy & Presser, P.C.

(57) ABSTRACT

Portions of a top compound semiconductor layer are recessed employing a gate electrode as an etch mask to form a source trench and a drain trench. A low temperature epitaxy process is employed to deposit a semiconductor material including at least one elemental semiconductor material in the source trench and the drain trench. Metallization is performed on physically exposed surfaces of the elemental semiconductor material portions in the source trench and the drain trench by depositing a metal and inducing interaction with the metal and the at least one elemental semiconductor material. A metal semiconductor alloy of the metal and the at least one elemental semiconductor material can be performed at a temperature lower than 600° C. to provide a high electron mobility transistor with a well-defined device profile and reliable metallization contacts.

13 Claims, 18 Drawing Sheets

(56) References Cited

U.S. PATENT DOCUMENTS

| | | | |
|---|---|---|---|
| 7,972,915 B2 | 7/2011 | Chen et al. | |
| 8,624,296 B1 | 1/2014 | Wong et al. | |
| 2004/0227154 A1* | 11/2004 | Chu et al. | 257/194 |
| 2004/0256614 A1* | 12/2004 | Ouyang et al. | 257/20 |
| 2006/0157733 A1 | 7/2006 | Lucovsky et al. | |
| 2006/0220165 A1 | 10/2006 | Hase | |
| 2006/0226442 A1 | 10/2006 | Zhang et al. | |
| 2007/0114569 A1* | 5/2007 | Wu et al. | 257/194 |
| 2008/0308813 A1* | 12/2008 | Suh et al. | 257/76 |
| 2010/0184262 A1 | 7/2010 | Smorchkova et al. | |
| 2010/0244105 A1 | 9/2010 | Hwang | |
| 2012/0056161 A1 | 3/2012 | Avouris et al. | |
| 2012/0097973 A1 | 4/2012 | Shi et al. | |
| 2012/0146046 A1 | 6/2012 | Ohki et al. | |
| 2012/0210932 A1 | 8/2012 | Hekmatshoartabari et al. | |
| 2012/0280244 A1 | 11/2012 | Hwang et al. | |
| 2013/0009133 A1 | 1/2013 | Avouris et al. | |
| 2013/0256753 A1 | 10/2013 | Morizuka et al. | |
| 2013/0264579 A1 | 10/2013 | Bridger et al. | |
| 2014/0131720 A1 | 5/2014 | Hsiung et al. | |
| 2014/0203289 A1 | 7/2014 | Liu et al. | |

OTHER PUBLICATIONS

Office Action dated Feb. 27, 2014 received in a related U.S. Patent Application, namely U.S. Appl. No. 13/898,580.

Office Action dated Feb. 27, 2014 received in a related U.S. Patent Application, namely U.S. Appl. No. 14/019,713.

Ohmi, T. et al., "Very-Low-Temperature Epitaxial Silicon Growth By Low-Kinetic-Energy Particle Bombardment" Japanese Journal of Applied Physics (Nov. 1998) pp. L2146-L2148, vol. 27, No. 11.

Ohmi, T. et al., "In situ-doped epitaxial silicon film growth at 250 degrees C by an ultra-clean low-energy bias sputtering" IEEE International Electron Devices Meeting, IEDM '89, Technical Digest (Dec. 3-6, 1989) pp. 53-56.

Shahrjerdi, D. et al., "Low-Temperature Epitaxy of Compressively Strained Silicon Directly on Silicon Substrates" Journal of Electronic Materials (Mar. 2012) pp. 494-497, vol. 41, No. 3.

Office Action dated Mar. 27, 2015 received in U.S. Appl. No. 13/898,580.

Notice of Allowance dated Jul. 1, 2014 received in U.S. Appl. No. 14/019,717.

Notice of Allowance dated Oct. 6, 2015 received in U.S. Appl. No. 13/898,580.

* cited by examiner

ELEMENTAL SEMICONDUCTOR MATERIAL CONTACT FOR HIGH ELECTRON MOBILITY TRANSISTOR

RELATED APPLICATIONS

The present application is related to a copending U.S. patent application Ser. No. 13/898,580, the entire contents of which are incorporated herein by reference.

BACKGROUND

The present application relates to a semiconductor structure, and particularly to high electron mobility transistors (HEMT's) including self-aligned embedded elemental semiconductor contact structures and methods of manufacturing the same.

Most metallization schemes for high electron mobility transistors require a high annealing temperature above 900° C. to form low resistance Ohmic contact to a compound semiconductor material such as AlGaN. However, the integrity of a gate electrode for a high electron mobility transistor is compromised above 600° C. due to the reaction with aluminum in an Ohmic metallization scheme. Reducing the temperature of the metallization process as known in the art always results in formation of inferior quality contacts. Further, the quality of contacts to the compound semiconductor material layer is highly variable due to process variations and temperature dependence of the metallization process.

SUMMARY

Portions of a top compound semiconductor layer are recessed employing a gate electrode as an etch mask to form a source trench and a drain trench. A low temperature epitaxy process is employed to deposit a semiconductor material including at least one elemental semiconductor material in the source trench and the drain trench. Metallization is performed on physically exposed surfaces of the elemental semiconductor material portions in the source trench and the drain trench by depositing a metal and inducing interaction with the metal and the at least one elemental semiconductor material. A metal semiconductor alloy of the metal and the at least one elemental semiconductor material can be performed at a temperature lower than 600° C. to provide a high electron mobility transistor with a well-defined device profile and reliable metallization contacts.

According to an aspect of the present disclosure, a semiconductor structure including a high electron mobility transistor (HEMT) is provided. The HEMT includes a substrate including a stack, from bottom to top, of a substrate compound semiconductor layer and a top compound semiconductor layer, and a gate electrode contacting a horizontal surface of a portion of the top compound semiconductor layer. The HEMT further includes a source region embedded in the substrate, and a drain region embedded in the substrate and laterally spaced from the source region. The second portion is laterally spaced from the first portion by a width of the gate electrode. Each of the source region and the drain region includes at least one elemental semiconductor material.

According to another aspect of the present disclosure, a method of forming a semiconductor structure is provided. A substrate including a vertical stack of a substrate compound semiconductor layer and a top compound semiconductor layer is provided. A gate electrode is formed on a horizontal surface of a portion of the top compound semiconductor layer. A source-side trench and a drain-side trench are formed in the substrate employing the gate electrode as an etch mask. A source region and a drain region are formed by selectively depositing at least one elemental semiconductor material in the source-side trench and the drain-side trench.

DETAILED DESCRIPTION

Figure 1:
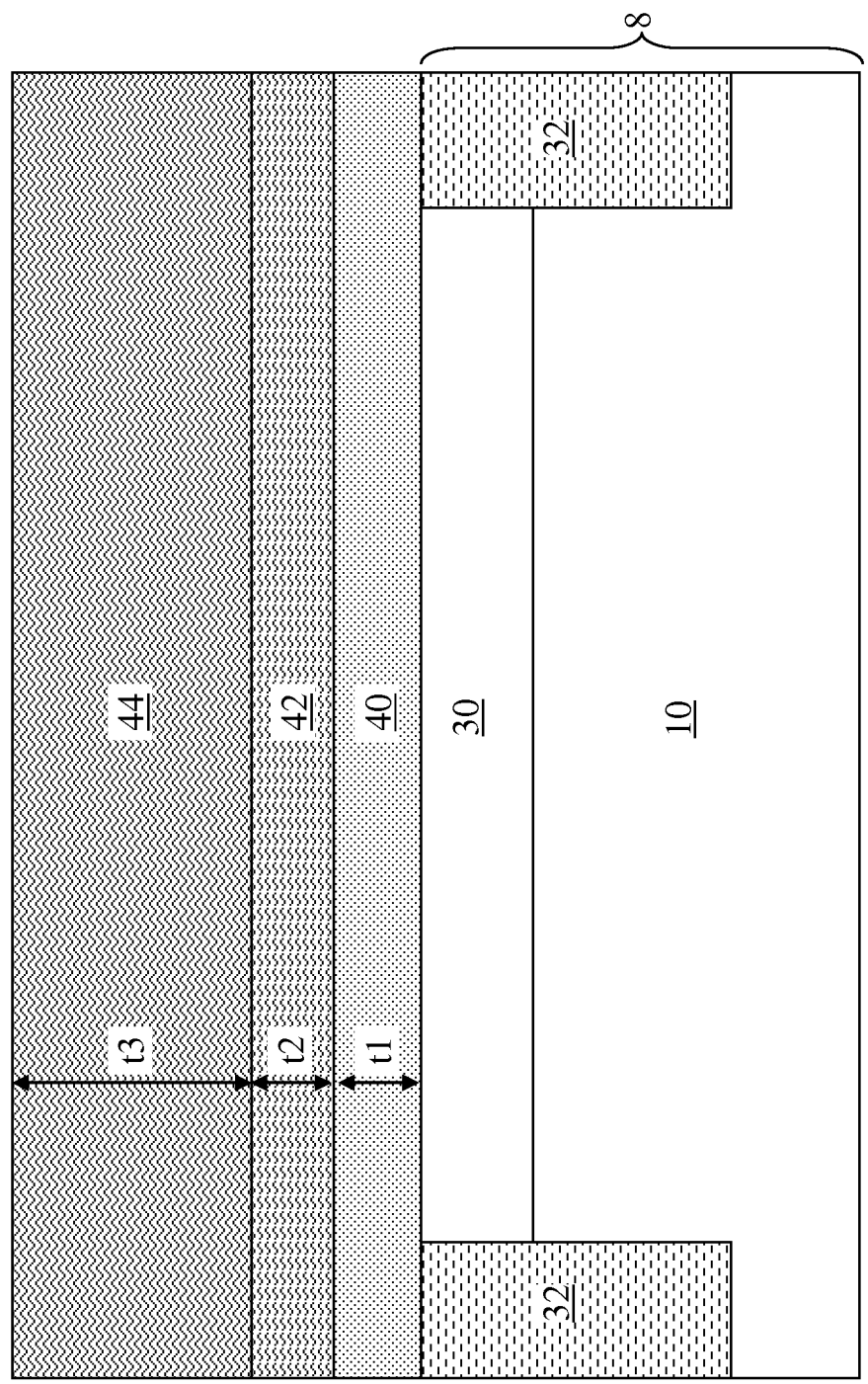
FIG. 1 is a vertical cross-sectional view of a first exemplary semiconductor structure after formation of a dielectric material layer, a first photoresist layer, and a second photoresist layer according to a first embodiment of the present disclosure.

As stated above, the present disclosure relates to particularly to high electron mobility transistors (HEMT's) including self-aligned embedded elemental semiconductor contact structures and methods of manufacturing the same. Aspects of the present disclosure are now described in detail with accompanying figures. It is noted that like and corresponding elements mentioned herein and illustrated in the drawings are referred to by like reference numerals. As used herein, ordinals such as "first" and "second" are employed merely to distinguish similar elements, and different ordinals may be employed to designate a same element in the specification and/or claims.

As used herein, a high electron mobility transistor (HEMT) refers to a field-effect transistor incorporating a junction between two materials with different band gaps as the channel through which charge carriers flow.

Referring to FIG. 1, a first exemplary semiconductor structure according to a first embodiment of the present disclosure includes a substrate 8 and a stack of material layers formed thereupon. The substrate 8 includes a vertical stack of a substrate compound semiconductor layer 10 and a top compound semiconductor layer 30. The substrate compound semiconductor layer 10 includes a first single crystalline compound semiconductor material. As used herein, a compound semiconductor material refers to a semiconductor material formed by at least two different elements belonging to different groups in the Periodic Table of the Elements. The compound semiconductor material can be a III-V compound semiconductor material or a II-VI compound semiconductor material. As used herein, a single crystalline compound semiconductor material refers to a compound semiconductor material in which atoms are located in a crystallographic lattice. In one embodiment, the first single crystalline compound semiconductor material can be single crystalline gallium nitride (GaN) or single crystalline gallium arsenide (GaAs). In one embodiment, the thickness of the substrate compound semiconductor layer 10 can be in a range from 500 nm to 1 mm, although lesser and greater thicknesses can also be employed.

The top compound semiconductor layer 30 includes a second single crystalline compound semiconductor material having a greater charge carrier mobility than the first single crystalline compound semiconductor material. In one embodiment, the second single crystalline compound semiconductor material can have a greater electron mobility than the first single crystalline compound semiconductor material. The top compound semiconductor layer 30 is epitaxially aligned to the substrate compound semiconductor layer 10 so that the entire stack of the substrate compound semiconductor layer 10 and the top compound semiconductor layer 30 is single crystalline, i.e., has an epitaxial alignment throughout the entirety thereof. In one embodiment, the substrate compound semiconductor layer 10 can include gallium nitride (GaN), and the top compound semiconductor layer 30 can include aluminum gallium nitride ($Al_xGa_{1-x}N$) in which x can be in a range, for example, from 0.20 to 0.35. In another embodiment, the substrate compound semiconductor layer 10 can include gallium nitride (GaAs), and the top compound semiconductor layer 30 can include aluminum gallium nitride ($Al_xGa_{1-x}As$) in which x can be in a range, for example, from 0.01 to 0.40. The top compound semiconductor layer 30 can be formed, for example, by molecular beam epitaxy (MBE) or chemical vapor deposition (CVD). In one embodiment, the thickness of the top compound semiconductor layer 30 can be in a range from 15 nm to 50 nm, although lesser and greater thicknesses can also be employed. Optionally, shallow trench isolation structures 32 can be formed in the substrate 8 to provide electrical isolation between multiple semiconductor devices to be formed therein.

In one embodiment, the stack of material layers formed on the top surface of the substrate 10 can include, from bottom to top, a dielectric material layer 40, a first photoresist layer 42, and a second photoresist layer 44. The dielectric material layer 40 includes a dielectric material such as silicon nitride, silicon oxide, silicon oxynitride, or a combination thereof. The dielectric material layer 40 can be deposited, for example, by chemical vapor deposition (CVD). The thickness of the dielectric material layer 40 is herein referred to as a first thickness t1, and can be, for example, from 15 nm to 100 nm, although lesser and greater thicknesses can also be employed.

The first photoresist layer 42 and the second photoresist layer 44 are selected such that the material of the first photoresist layer 42 and the material of the second photoresist layer 44 are of the same type and have different sensitivities to irradiation, which can be irradiation by an electron beam or an ultraviolet radiation.

For example, the first photoresist layer 42 and the second photoresist layer 44 are selected such that the material of the first photoresist layer 42 are positive photoresists, i.e., photoresists in which the portions exposed to light becomes soluble to a photoresist developer solution while the unexposed portions remain insoluble. In this case, the second photoresist layer 44 can be more sensitive to irradiation than the first photoresist layer 42. In an illustrative example, the first and second photoresist layers (42, 44) can include compounds having different compositions and including poly (methyl methacrylate) at different concentrations.

Alternately, the first photoresist layer 42 and the second photoresist layer 44 are selected such that the material of the first photoresist layer 42 are negative photoresists, i.e., photoresists in which the portions exposed to light becomes insoluble to a photoresist developer solution while the unexposed portions remain soluble. In this case, the second photoresist layer 44 can be less sensitive to irradiation than the first photoresist layer 42.

The thickness of the first photoresist layer 42 is herein referred to as a second thickness t2, and can be in a range from 20 nm to 50 nm, although lesser and greater thicknesses can also be employed. The thickness of the second photoresist layer 44 is herein referred to as a third thickness t3, and can be in a range from 40 nm to 200 nm, although lesser and greater thicknesses can also be employed.

Figure 2:
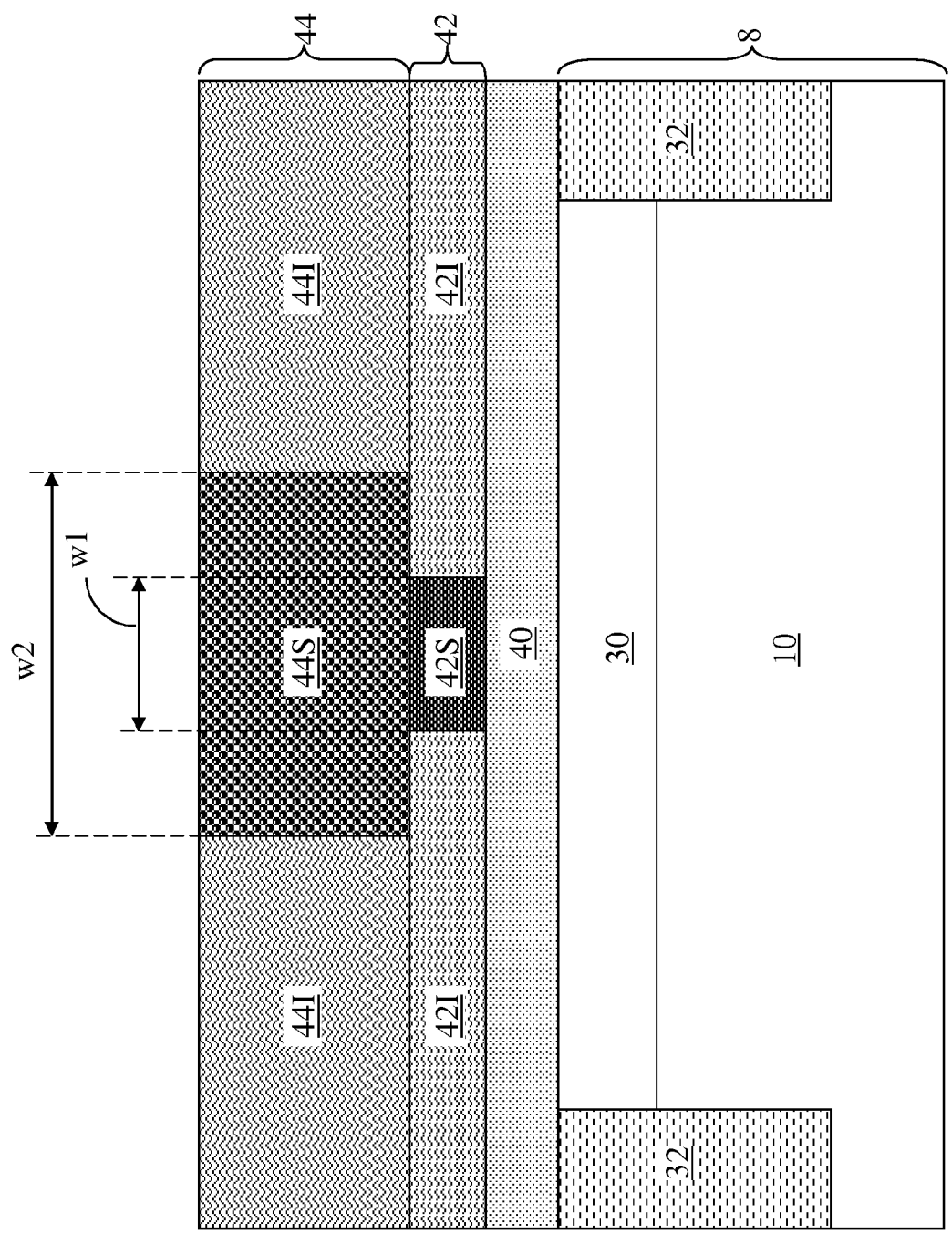
FIG. 2 is a vertical cross-sectional view of the first exemplary semiconductor structure after lithographic exposure of the first and second photoresist layers according to the first embodiment of the present disclosure.

Referring to FIG. 2, the first photoresist layer 42 and the second photoresist layer 44 can be lithographically exposed such that the intensity of radiation gradually decreases in peripheral regions. The gradual decrease of the intensity of radiation may be achieved, for example, by defocusing the radiation, i.e., shifting the distance between a lithographic mask and the first and second photoresist layers (42, 44) from an optimal distance.

A soluble first photoresist portion 42S and an insoluble first photoresist portion 42I can be formed within the first photoresist layer 42. In one embodiment, the soluble first photoresist portion 42S can have a uniform width that is invariant along a horizontal direction perpendicular to the plane of FIG. 2. This uniform width is herein referred to as a first width w1. Simultaneously, a soluble second photoresist portion 44S and an insoluble second photoresist portion 44I are formed within the second photoresist layer 44. In one embodiment, the soluble second photoresist portion 44S can have a uniform width that is invariant along a horizontal direction perpendicular to the plane of FIG. 2. This uniform width is herein referred to as a second width w2.

The polarity and the sensitivities of the photoresist materials of first and second photoresist layers (42, 44) are selected such that the second width w2 is greater than the first width w1. In one embodiment, the sidewalls of the soluble second photoresist portion 44S can be laterally offset from a proximal sidewall of the soluble first photoresist portion 42S by a same distance, i.e., (w2−w1)/2, which is herein referred to as a lateral offset distance. In one embodiment, the first width w1 can be in a range from 10 nm to 100 nm, and the second width w2 can be in a range from 15 nm to 150 nm, and the lateral offset distance can be in a range from 2.5 nm to 250 nm, although lesser and greater distances can also be employed.

Figure 3:
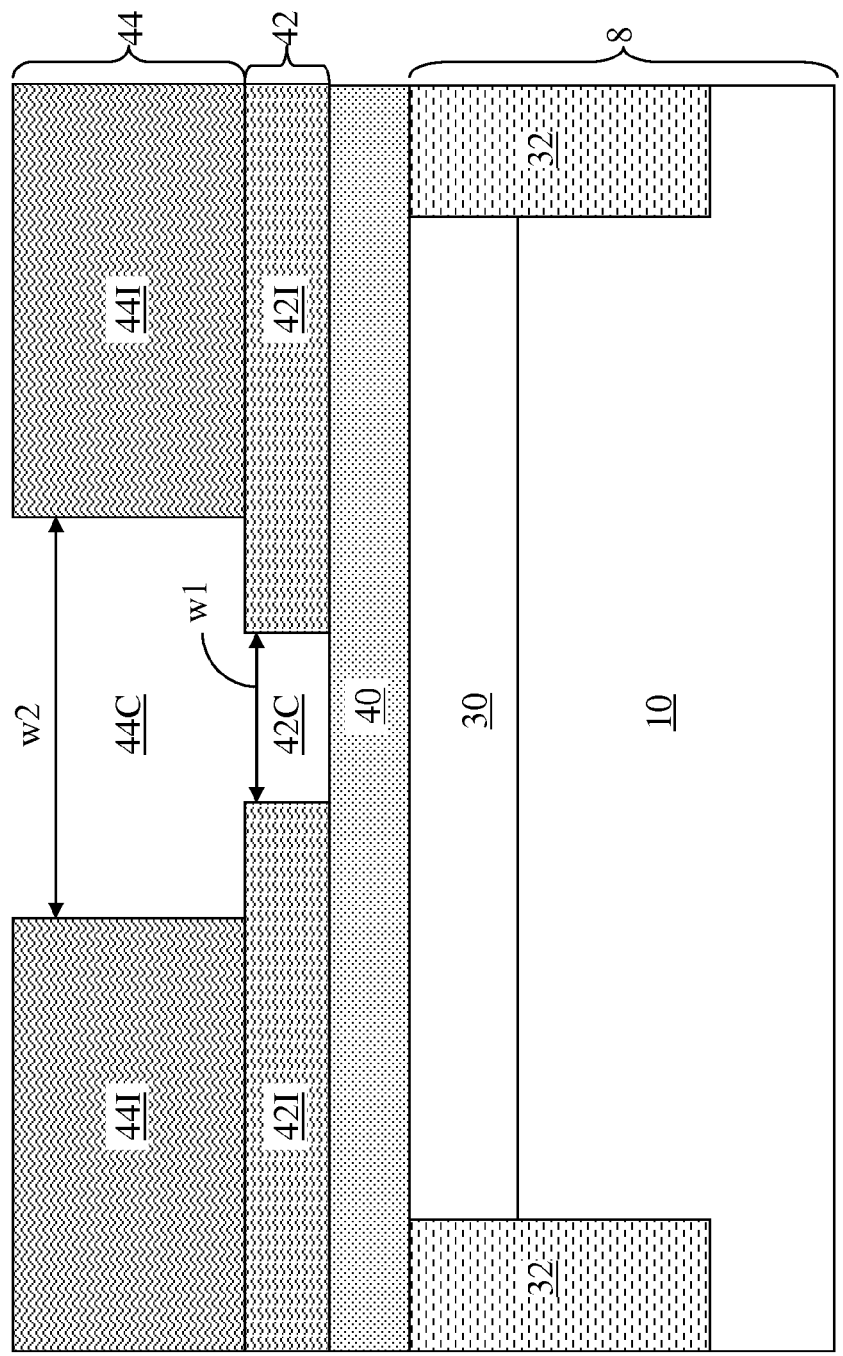
FIG. 3 is a vertical cross-sectional view of the first exemplary semiconductor structure after development of the first and second photoresist layers according to the first embodiment of the present disclosure.

Referring to FIG. 3, the soluble first photoresist portion 42S and the soluble second photoresist portion 44S can be removed, for example, by dissolving in a developer solution. A first opening 42C is formed in a volume from which the soluble first photoresist portion 42S is removed, and a second opening 44C is formed in a volume from which the soluble second photoresist portion 44S is removed. The first opening 42C can have the first width w1, and the second opening 44C can have the second width w2.

The insoluble second photoresist portion 44I constitutes a template material layer including an opening, i.e., the second opening 44C, therein. The template material layer is formed over the dielectric material layer 40 prior to transfer of the pattern in the insoluble first photoresist portion 42I into the dielectric material layer 40.

Figure 4:
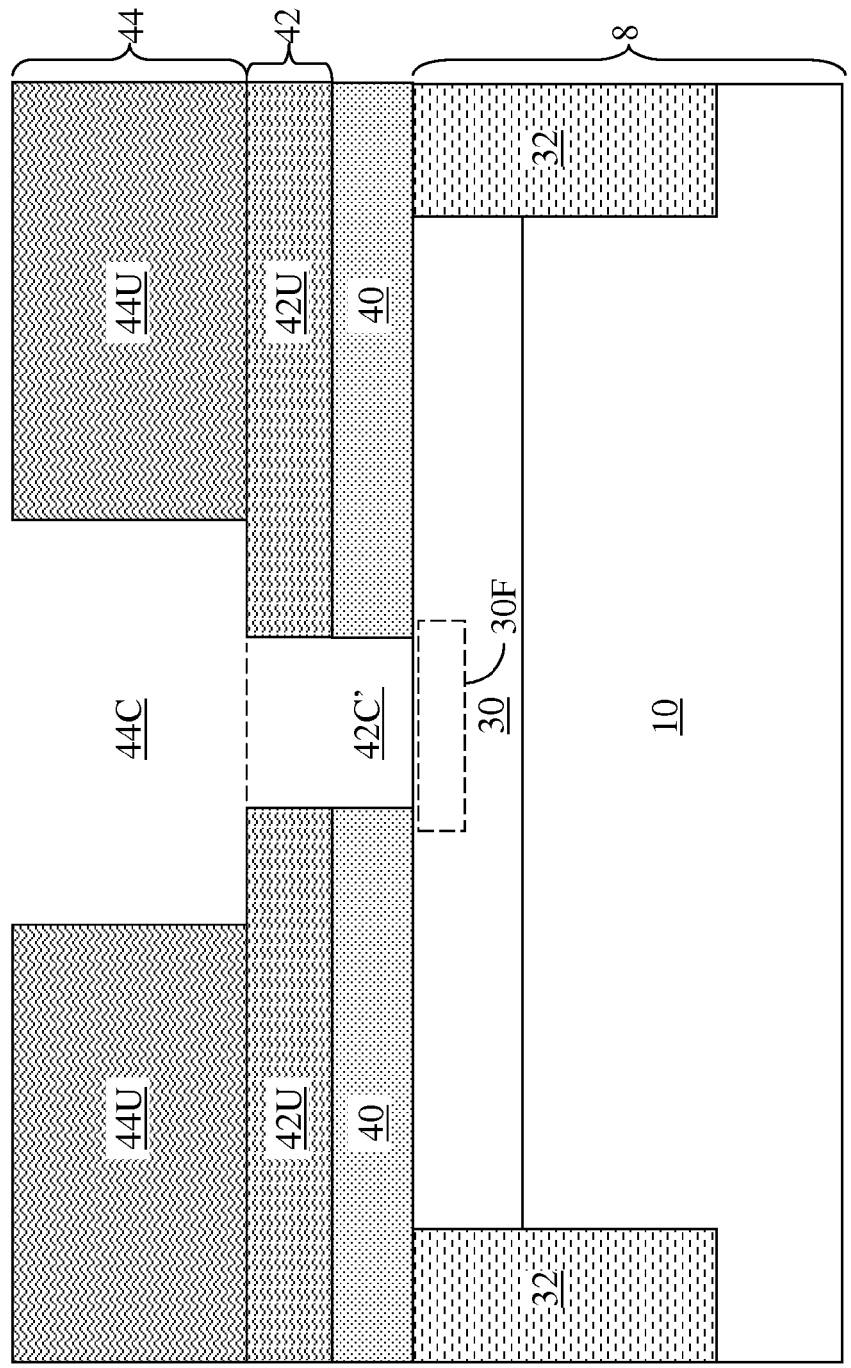
FIG. 4 is a vertical cross-sectional view of the first exemplary semiconductor structure after forming a hole in the dielectric material layer employing the first photoresist layer as an etch mask and optionally forming a fluorine-doped region according to the first embodiment of the present disclosure.

Referring to FIG. 4, the pattern in the insoluble first photoresist portion 42I can be transferred into the dielectric material layer 40 by an anisotropic etch. The anisotropic etch employs a remaining portion of the first photoresist layer 42, i.e., the insoluble first photoresist portion 42I, as an etch mask. A cavity 42C' that replicates the pattern of the first opening 42C is formed in the dielectric material layer 40. The second opening 44C in the template material layer, i.e., the insoluble second photoresist portion 44I, can overlie the entirety of the cavity 42C'. A portion of the top surface of the top compound semiconductor layer 30 is physically exposed within the cavity 42C'.

Optionally, the anisotropic etch can employ a fluorine-including gas during formation of the cavity 42C' through the dielectric material layer 40. Further, the anisotropic etch can continue after the top surface of the top compound semiconductor layer 30 is physically exposed with a decreased plasma intensity. In this case, fluorine atoms in the plasma can be introduced into the top compound semiconductor layer 30 without significantly etching the second single crystalline compound semiconductor material, and can form a fluorine-doped region 30F. The fluorine-doped region 30F can be formed in a surface portion of the top compound semiconductor layer 30 directly underneath the cavity 42C' in the dielectric material layer 40. The fluorine-doped region 30F can have a thickness less than the thickness of the top compound semiconductor layer 30, i.e., can be vertically spaced from the substrate compound semiconductor layer 10. In one embodiment the fluorine-doped region 30F can have a thickness in a range from 3 nm to 10 nm, although lesser and greater thicknesses can also be employed.

Figure 5:
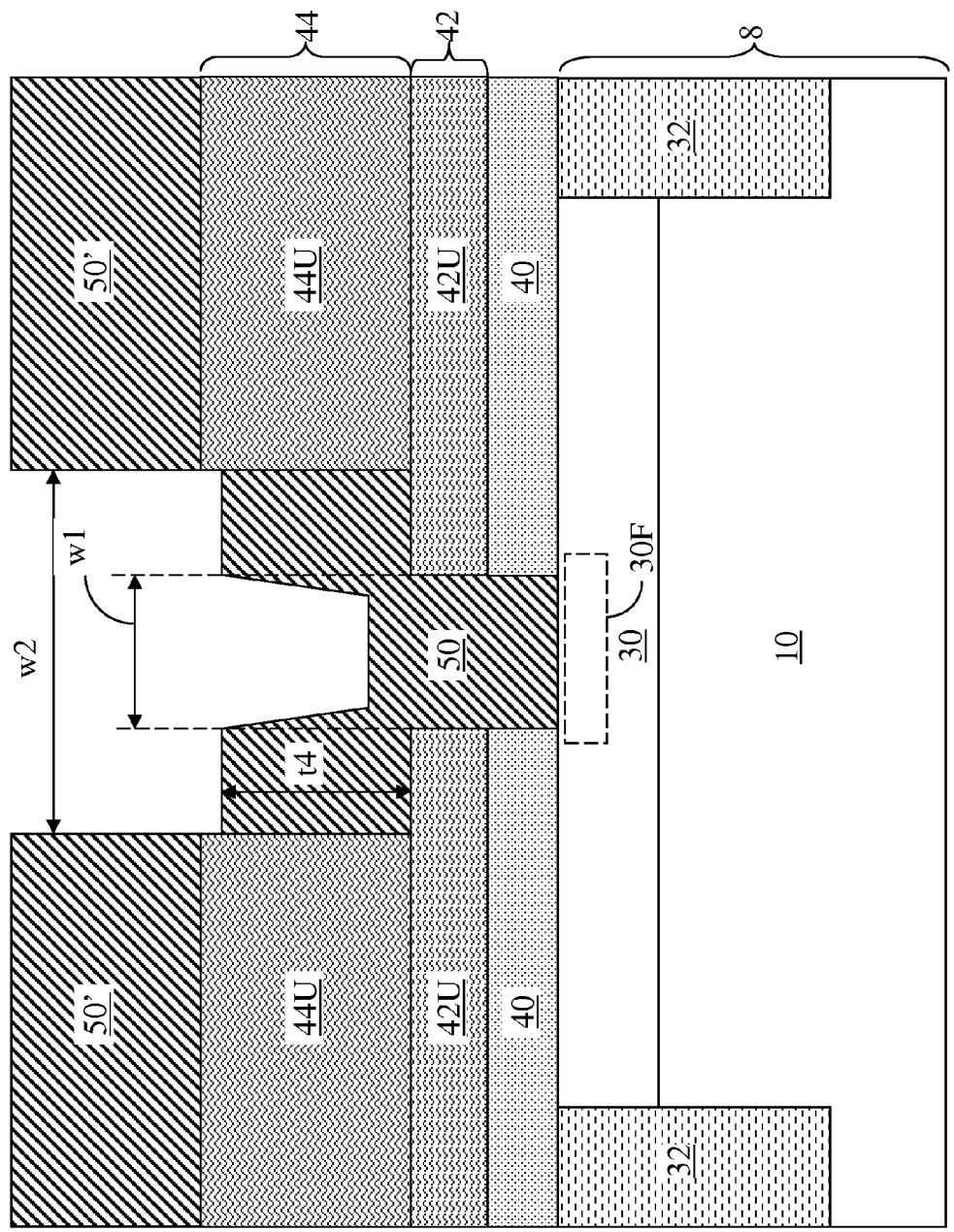
FIG. 5 is a vertical cross-sectional view of the first exemplary semiconductor structure after formation of a gate electrode by a directional deposition of at least one metallic material according to the first embodiment of the present disclosure.

Referring to FIG. 5, at least one conductive material can be directionally deposited in the cavity 42C', in the second opening 44C, and over the second photoresist layer 44. The directional deposition of the at least one conductive material can be performed, for example, by vacuum evaporation or a directional physical vapor deposition (PVD). The at least one conductive material can include, for example, a metallic material such as W, WN, Ni, Au, and/or combinations or alloys thereof.

A gate electrode 50 can be formed on a horizontal surface of a physically exposed portion of the top compound semiconductor layer 30, on sidewalls of the dielectric material layer 40 and the first photoresist layer 42, on a physically exposed top surface of the first photoresist layer 42, and sidewalls of the second photoresist layer 44. A conductive material portion 50' can be formed above the top surface of the second photoresist layer 44.

The thickness of the deposited conductive material(s) is herein referred to as a fourth thickness t4. The fourth thickness t4 is less than the third thickness t3, and is greater than the sum of the first thickness t1 and the second thickness t2.

The gate electrode 50 contacts a horizontal surface of a portion of the top compound semiconductor layer 10. The gate electrode 50 is a T-shaped gate electrode. The contact area in which the gate electrode 50 physically contacts a portion of the top compound semiconductor layer 30 has the first width t1. An upper portion of the gate electrode 50 includes a pair of sidewalls laterally spaced by the second width w2, which is greater than the first width w1.

Figure 6:
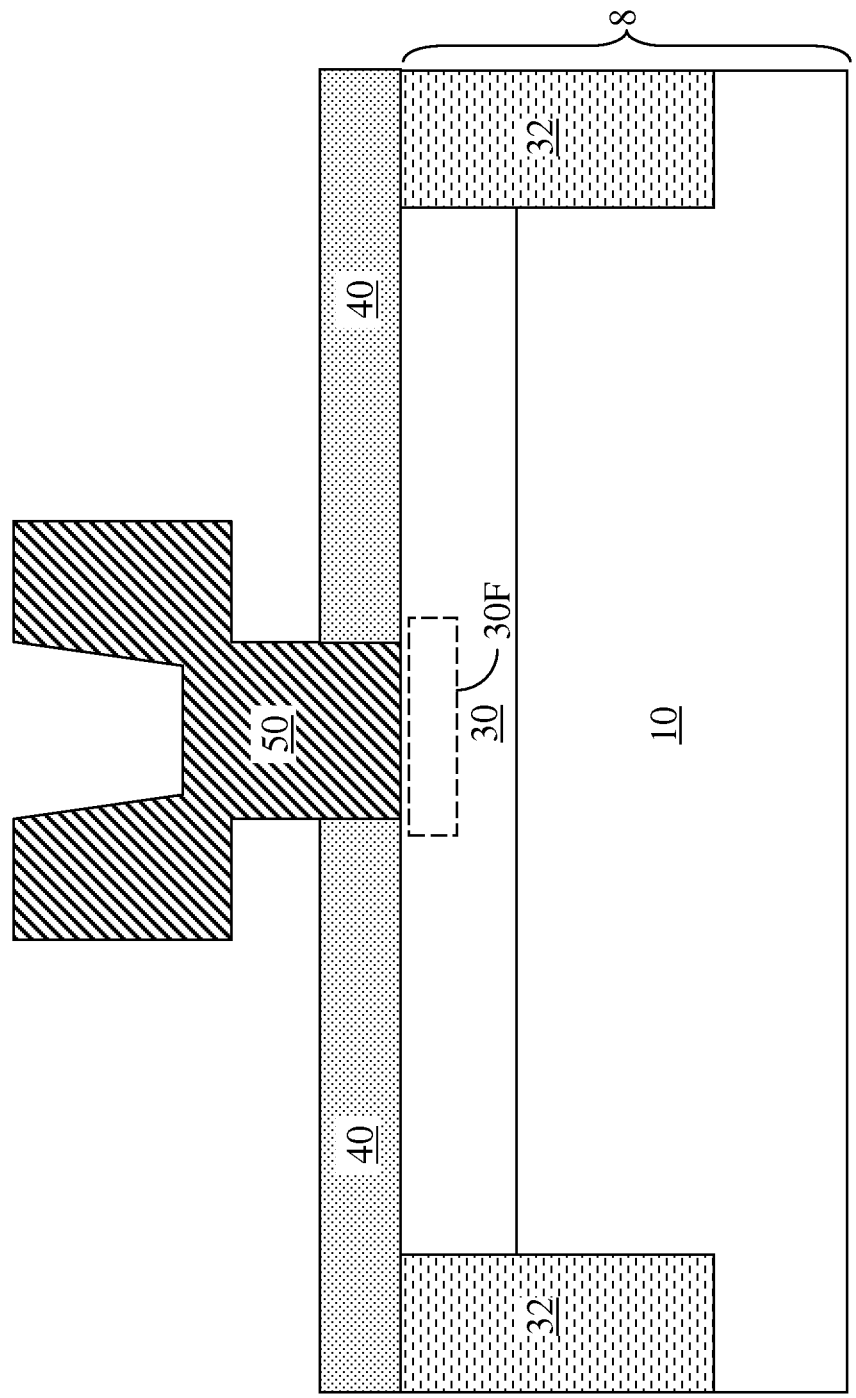
FIG. 6 is a vertical cross-sectional view of the first exemplary semiconductor structure after removing the first and second photoresist layers according to the first embodiment of the present disclosure.

Referring to FIG. 6, the first and second photoresist layers (42, 44) are removed selective to the dielectric material layer 40 and the gate electrode 50. For example, the first and second photoresist layers (42, 44) can be dissolved in an organic solvent, which does not dissolve the conductive material of the gate electrode 50 or the dielectric material layer 40. The conductive material portion 50' can be lifted off within the solvent as the first and second photoresist layers (42, 44) are dissolved. In one embodiment, the first exemplary semiconductor structure can be held upside down within the solvent to facilitate the lift-off of the conductive material portion 50' from the dielectric material layer 40.

Figure 7:
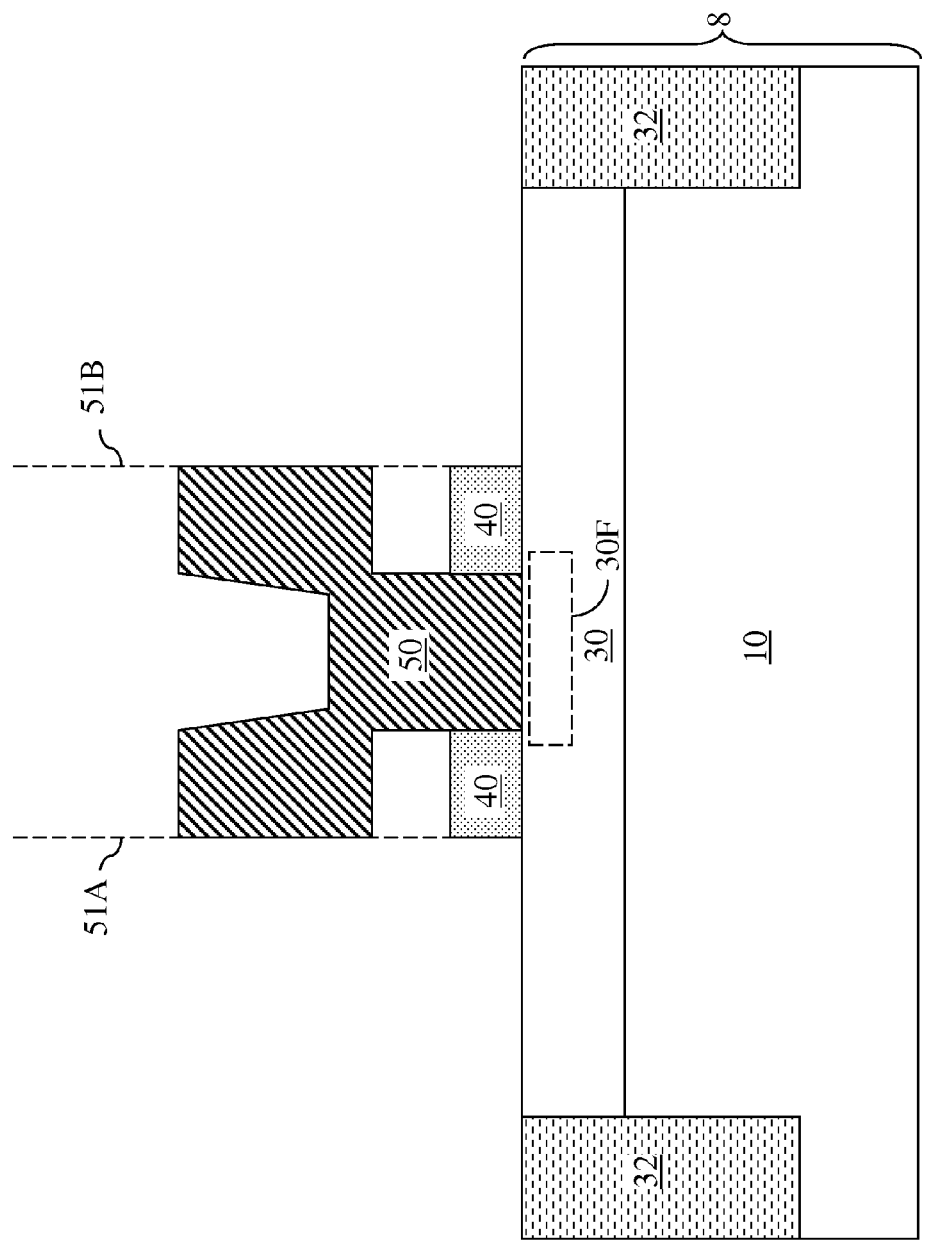
FIG. 7 is a vertical cross-sectional view of the first exemplary semiconductor structure after patterning the dielectric material layer according to the first embodiment of the present disclosure.

Referring to FIG. 7, the dielectric material layer 40 can be subsequently patterned by an anisotropic etch that employing the gate electrode 50 as an etch mask. The anisotropic etch can be, for example, a reactive ion etch that employs a hydrofluorocarbon gas such as $CF_4$, $CH_2F_2$, or $C_4F_8$. The anisotropic etch terminates upon detection of the physically exposed surfaces of the top compound semiconductor layer 30 to avoid introduction of fluorine into the top compound semiconductor layer 30. A wet clean may be optionally employed to remove any etch residue material from the physically exposed portions of the top surface of the top compound semiconductor layer 30.

A first sidewall of the remaining portion of the dielectric material layer 40 can be vertically coincident with a first sidewall of the upper portion of the gate electrode 50, and a second sidewall of the remaining portion of the dielectric material layer 40 can be vertically coincident with a second sidewall of the upper portion of the gate electrode 50. As used herein, two surfaces are "vertically coincident" with each other if there exists a vertical plane from which each of the two surfaces do not deviate by more than the sum of surface roughnesses of the two surfaces. The first sidewall of the upper portion of the gate electrode 50 and the first sidewall of the dielectric material layer 40 can be within a first vertical plane 51A, and the second sidewall of the upper portion of the gate electrode 50 and the second sidewall of the dielectric material layer 40 can be within a second vertical plane 51B.

Figure 8:
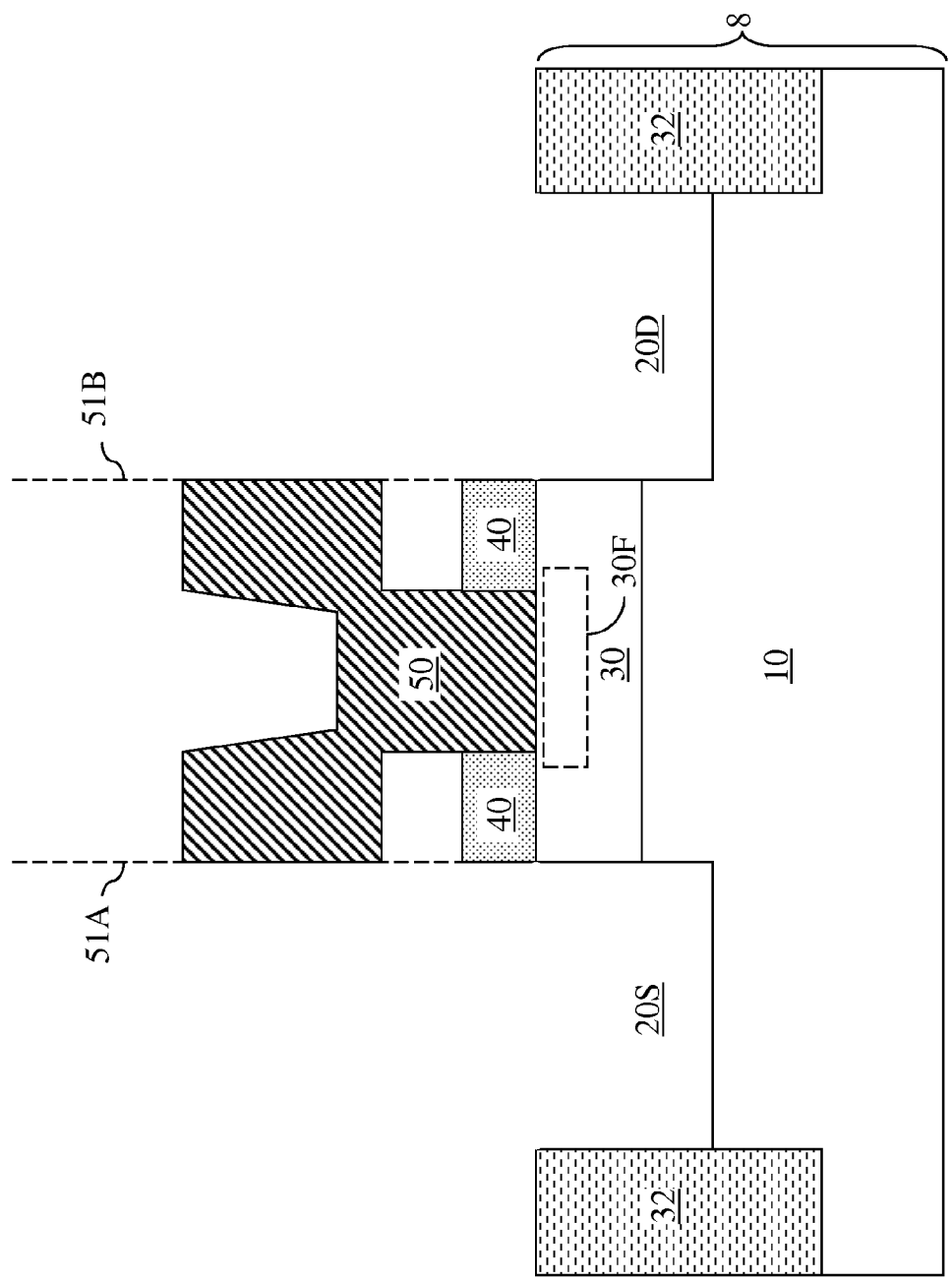
FIG. 8 is a vertical cross-sectional view of the first exemplary semiconductor structure after formation of a source-side trench and a drain-side trench according to the first embodiment of the present disclosure.

Referring to FIG. 8, an anisotropic etch can be performed to remove physically exposed portions of the top compound semiconductor layer 30 and the substrate compound semiconductor layer 10. The anisotropic etch employs an etch chemistry that removes the semiconductor materials of the top compound semiconductor layer 30 and the substrate compound semiconductor layer 10 selective to the metallic material(s) of the gate electrode 50 and the dielectric material of the shallow trench isolation structures 32. The gate electrode 50 is thus employed as an etch mask during the anisotropic etch. A source-side trench 20S and a drain-side trench 20D are formed in the substrate 8.

The source-side trench 20S has a vertical sidewall that is within the first vertical plane 51A, i.e., the vertical plane including a first sidewall of the upper portion of the gate electrode 50 and a first sidewall of the dielectric material layer 40. The drain-side trench 20D has a vertical sidewall that is within the first vertical plane 51B, i.e., the vertical plane including a second sidewall of the upper portion of the gate electrode 50 and a second sidewall of the dielectric material layer 40. The depth of the source-side trench 20S and the drain-side trench 20D can be greater than the thickness of the top compound semiconductor layer 30. Thus, the source-side trench 20S and the drain-side trench 20D extend below a horizontal plane including an interface between the top compound semiconductor layer 30 and the substrate compound semiconductor layer 10. A recessed horizontal surface of the substrate compound semiconductor layer 10 can be physically exposed in each of the source-side trench 20S and the drain-side trench 20D.

Figure 9:
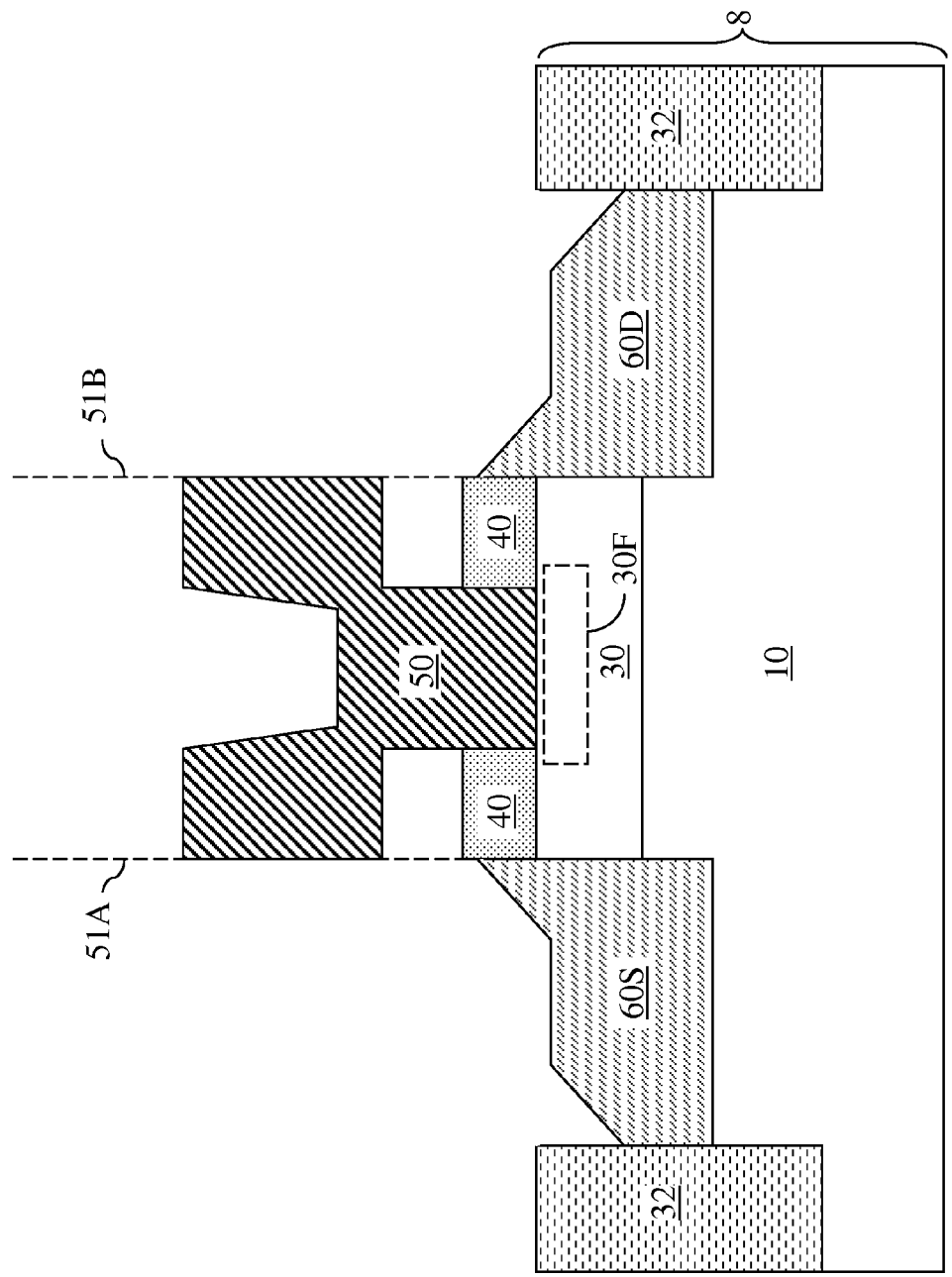
FIG. 9 is a vertical cross-sectional view of the first exemplary semiconductor structure after formation of a source region and a drain region by selective deposition of at least one elemental semiconductor material according to the first embodiment of the present disclosure.

Referring to FIG. 9, at least one elemental semiconductor material can be deposited in the source-side trench 20S and the drain-side trench 20D by a selective deposition process. As used herein, a selective deposition process refers to a deposition process that deposits a material on surfaces of a first type, while not depositing any material on surfaces of a second type. Specifically, the at least one elemental semiconductor material can be deposited on semiconductor surfaces, while not being deposited on dielectric surfaces or metallic surfaces. A source region 60S including the deposited at least one elemental semiconductor material is formed within the source-side trench 20S, and a drain region 60D including the deposited at least one elemental semiconductor material is formed within the drain-side trench 20D.

As used herein, an elemental semiconductor material refers to silicon, germanium, and carbon. The at least one elemental semiconductor material can include a single elemental semiconductor element, or can include an alloy of at least two elemental semiconductor elements. Thus, the at least one elemental semiconductor material as deposited can be elemental silicon, elemental germanium, a silicon-germanium alloy, a silicon-carbon alloy, or a silicon-germanium-carbon alloy. The at least one elemental semiconductor material in the source region 60S and the drain region 60D can be intrinsic, or can be doped with n-type dopants such as P, As, or Sb, or can be doped with p-type dopants such as B, Ga, or In.

In an exemplary embodiment, the at least one elemental semiconductor material can be a crystalline silicon-and-hydrogen-containing material. The crystalline silicon-and-hydrogen-containing material includes silicon and hydrogen, and can be single-crystalline or polycrystalline. Thus, each of the source region 60S and the drain region 60D includes the crystalline silicon-and-hydrogen-containing material.

The crystalline silicon-and-hydrogen-containing material can be deposited, for example, by plasma-enhanced chemical vapor deposition (PECVD) or by hot-wire CVD (HWCVD). The deposition temperature can be in a range from room temperature (i.e., 20° C.) to 450° C. In one embodiment, the crystalline silicon-and-hydrogen-containing material can be deposited at a deposition temperature in a range from 150° C. to 250° C.

If a PECVD process or a HWCVD process is employed to deposit the crystalline silicon-and-hydrogen-containing material, the gas sources (precursor gases) used for the growth of the crystalline silicon-and-hydrogen-containing material may include, but are not limited to, $SiH_4$ (silane), $Si_2H_6$ (disilane), $SiH_2Cl_2$ (dichlorosilane), $SiF_4$ (tetrafluorosilane), and combinations thereof. Hydrogen gas may be employed as a carrier gas (i.e., a dilution gas). In one embodiment, the ratio of the flow rate of the carrier gas to the flow rate of the precursor gas can be greater than 5.

The crystalline silicon-and-hydrogen-containing material can be in-situ doped, for example, by providing a dopant gas in the process chamber. In one embodiment, the dopant gas can be $PH_3$, $AsH_3$, or $SbH_3$ for n-type doping, or can be $B_2H_6$ (diborane) or trimethylboron (TMB) for p-type doping. The concentration of activated dopants in the source region 60S and the drain region 60D can be in a range from $1.0 \times 10^{18}/cm^3$ to $3.0 \times 10^{20}/cm^3$, although lesser and greater concentrations of activated dopants can also be employed. The total concentration of dopants in the source region 60S and the drain region 60D can be in a range from $1.0 \times 10^{18}/cm^3$ to $1.0 \times 10^{21}/cm^3$, although lesser and greater total concentrations of dopants can also be employed. The content of hydrogen in the deposited crystalline silicon-and-hydrogen-containing material can be in a range from 5 atomic percent to 40 atomic percent, although lesser and greater atomic percentages can also be employed.

The crystalline silicon-and-hydrogen-containing material may additionally contain germanium (Ge), nitrogen (N), oxygen (O), fluorine (F), deuterium (D), chlorine (Cl), carbon (C) and/or combinations thereof. The gas source employed for incorporating germanium can be, for example, germane ($GeH_4$). The gas source employed for incorporating carbon can be, for example, methane ($CH_4$), ethylene ($C_2H_4$), propylene ($C_3H_6$), and other hydrocarbon gases having a formula of $C_xH_y$, in which x is an integer greater than 1, and y is not greater than 2x+2.

In one embodiment, selective growth of the crystalline silicon-and-hydrogen-containing material may be obtained by in-situ etching of non-crystalline (i.e., amorphous) silicon-and-hydrogen-containing material in a hydrogen ($H_2$) plasma. An etching process of the amorphous silicon-and-hydrogen-containing material is employed to concurrently form epitaxial silicon-and-hydrogen-containing material on exposed single crystalline surfaces of the first and second compound semiconductor materials of the substrate compound semiconductor layer 10 and the top compound semiconductor layer 30. It should be understood that the epitaxial growth and etching may be performed sequentially or concurrently as needed.

In a non-limiting illustrative example, the crystalline silicon-and-hydrogen-containing material can be deposited at a pressure of about 500 mTorr, at a ratio of $H_2$ flow rate to $SiH_4$ flow rate of about 14, and at a power density of about 4 mW/cm$^2$. A $H_2$ plasma etch can be performed at a temperature of about 150° C. at about 900 mTorr, resulting in an etch selectivity of approximately 1:3 for the crystalline silicon-and-hydrogen-containing material with respect to an amorphous silicon-and-hydrogen-containing material. It should be understood that the amorphous silicon-and-hydrogen-containing material grown on the gate electrode 50, the shallow trench isolation structures 32, and the dielectric material layer 40 are etched using a plasma of a gas, which can be one or a combination of $H_2$, HCl, $CL_2$, Ar, etc. The epitaxial deposition and the plasma etch may be performed sequentially or concurrently in a same chamber. The selective epitaxial growth can be achieved either by alternating gas pulses responsible for the epitaxial growth (e.g., silane and dopant species) and the etch (plasma etchants.) or by simultaneous flow of all the gases. Further details regarding the epitaxial growth and selective removal process are described in U.S. Patent Application Publication No. 2012/0210932 to Hekmatshoar-Tabari published on Aug. 23, 2012, the entire contents of which are incorporated herein by reference.

Thus, the source region 60S and the drain region 60D are formed by selectively depositing the at least one elemental semiconductor material in the source-side trench 20S and the drain-side trench 20D. In one embodiment, the at least one elemental semiconductor material can be deposited by selective epitaxy with epitaxial alignment with the second single crystalline compound semiconductor material of the top compound semiconductor layer 30. In yet another embodiment, each of the source region 60S and the drain region 60D can include a single crystalline or polycrystalline silicon material, a single crystalline or polycrystalline germanium material, or a single crystalline or polycrystalline alloy of silicon and germanium. In one embodiment, the source region 60S and the drain region 60D can consist essentially of the at least one semiconductor material, hydrogen atoms, and electrical dopant atoms. As used herein, electrical dopant atoms refer to p-type dopant atoms and/or n-type dopant atoms.

In one embodiment, a bottom surface of the source region 60S and a bottom surface of the drain region 60D can be in contact with the first single crystalline compound semiconductor material of the substrate compound semiconductor layer 10. In one embodiment, the at least one elemental semiconductor material can be deposited by selective epitaxy with epitaxial alignment with the second single crystalline compound semiconductor material of the top compound semiconductor layer 30 and with epitaxial alignment with the first single crystalline compound semiconductor material of the substrate compound semiconductor layer 10. In one embodiment, a sidewall of the source region 60S can be vertically coincident with one of the pair of outer sidewalls of the upper portion of the gate electrode 50, i.e., within the first vertical plane 51A, and a sidewall of the drain region 60D can be vertically coincident with another of the pair of outer sidewalls of the upper portion of the gate electrode 50, i.e., within the second vertical plane 51B.

The source region 60S and the drain region 60D are embedded within the substrate 8. All sidewalls of the source region 60S and all sidewalls of the drain region 60D can be vertical, and contact vertical surfaces of the first and second single crystalline compound semiconductor materials or, if shallow trench isolation structures 32 are present, contact sidewalls of the shallow trench isolation structures 32. In one embodiment, the source region 60S and the drain region 60D can include a single crystalline material portion of at least one elemental semiconductor material and can be lattice-mismatched with respect to the second single crystalline compound semiconductor material of the top compound semiconductor layer 30. In this case, the source region 60S and the drain region 60D can exert a compressive stress or a tensile stress to the remaining portions of the top compound semiconductor layer 30. In one embodiment, the polarity of the applied stress can be selected so that the mobility of charge carriers (e.g., electrons) are increased relative to a state in which no external stress is applied. In this case, the HEMT can provide a greater on-current due to the external stress applied by the source region 60S and the drain region 60D.

Figure 10:
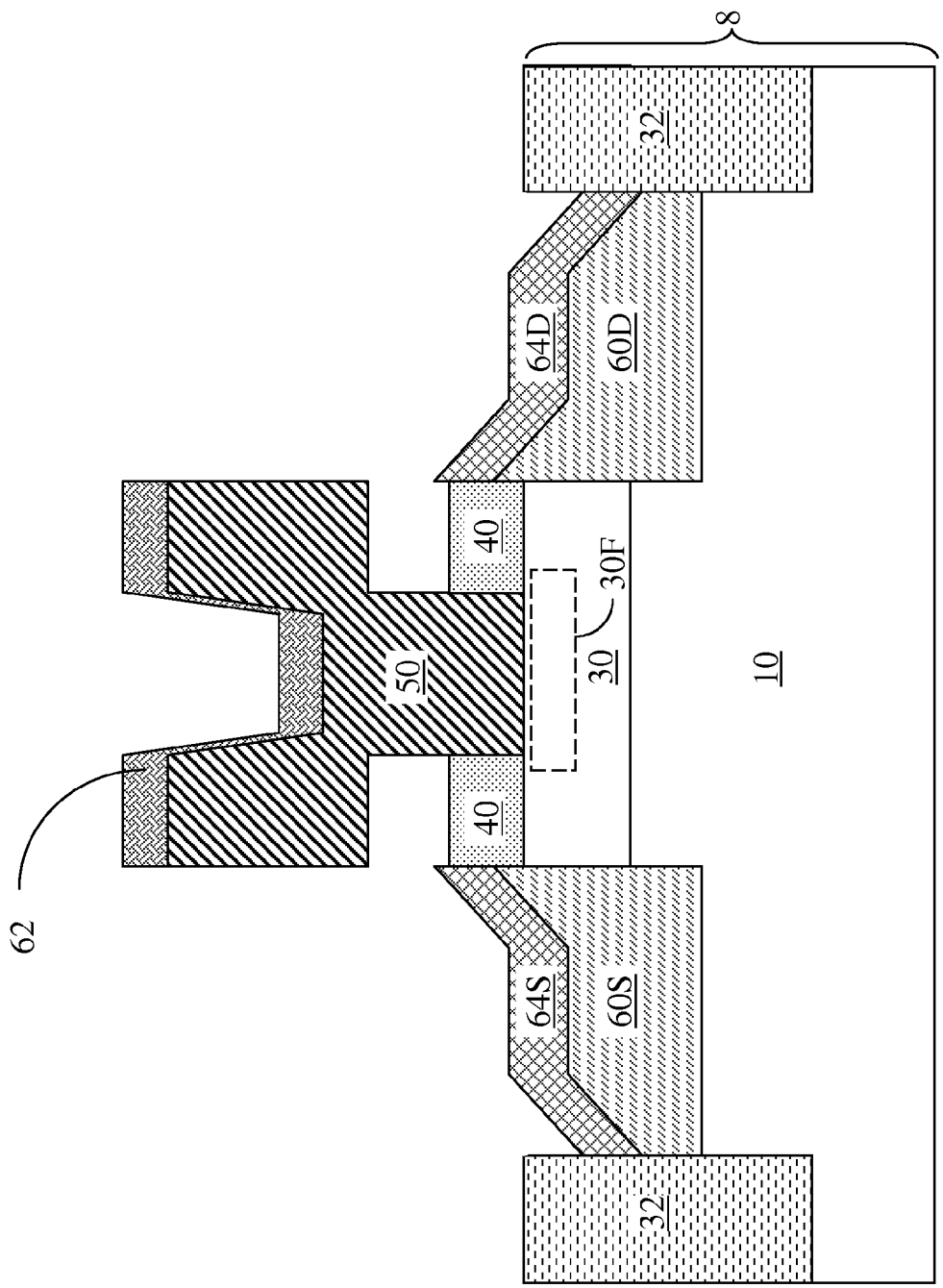
FIG. 10 is a vertical cross-sectional view of the first exemplary semiconductor structure after formation of metal-semiconductor alloy portions according to the first embodiment of the present disclosure.

Referring to FIG. 10, a metallic material can be deposited on the top surfaces of the source region 60S and the drain region 60D, and on the top surfaces of the gate electrode 50 and the shallow trench isolation structures 32. The metallic material can be a material that interacts with the semiconductor material of the source region 60S and the drain region 60D to form a metal-semiconductor alloy such as metal silicides. For example, the deposited metallic material can be nickel or a nickel alloy. The metallic material can be deposited, for example, by physical vapor deposition (PVD). The thickness of the deposited metallic material can be in a range from 3 nm to 30 nm, although lesser and greater thicknesses can also be employed.

Optionally, the deposited metallic material may be removed, for example, by applying a photoresist layer (not shown) and forming openings in the photoresist layer over areas of the shallow trench isolation structures, and by removing the deposited metallic material from above the shallow trench isolation structures 32. The photoresist layer can be subsequently removed, for example, by ashing.

A metallization anneal can be performed at an elevated temperature to form a source-side metal-semiconductor alloy portion 64S directly on a top surface of the source region 60S, and a drain-side metal-semiconductor alloy portion 64D directly on a top surface of the drain region 60D. If the source region 60S and the drain region 60D include a crystalline silicon-and-hydrogen-containing material, the source-side metal-semiconductor alloy portion 64S and the drain-side metal-semiconductor alloy portion 64D include an alloy of the crystalline silicon-and-hydrogen-containing material and the deposited metallic material such as nickel silicide, nickel germanide, and nickel germanosilicide. The temperature of the metallization anneal can be lower than 600° C. The hydrogen content of the source region 60S and the drain region 60D may decrease after the metallization anneal may be in a range from 0.1 atomic percent to 20 atomic percent, although lesser and greater atomic percentages can also be employed. The thickness of the source-side metal-semiconductor alloy portion 64S and the drain-side metal-semiconductor alloy portion 64D can be in a range from 5 nm to 50 nm, although lesser and greater thicknesses can also be employed.

A metallic gate electrode cap 62 can be formed on the top surface of the gate electrode 50 by the deposited metallic material. Optionally, the metallic gate electrode cap 62 and any other unreacted portion of the deposited metallic material can be removed selective to the source-side metal-semiconductor alloy portion 64S and the drain-side metal-semiconductor alloy portion 64D by a wet etch. The chemistry of the wet etch is selected such that unreacted portions of the deposited metallic material can be etched selective to the metal-semiconductor alloy portions (64S, 64D).

The at least one elemental semiconductor material of the source region 60S and the drain region 60D is conducive to metallization at a lower temperature than the first and second single crystalline compound semiconductor materials of the substrate compound semiconductor layer 10 and the top compound semiconductor layer 30. As such, the at least one elemental semiconductor material of the source region 60S and the drain region 60D, which can include single crystalline or polycrystalline silicon, single crystalline or polycrystalline germanium, a single crystalline or polycrystalline silicon-germanium alloy, or a single crystalline or polycrystalline silicon-germanium-carbon alloy, can be provided with an Ohmic contact through formation of a metal silicide, a metal germanide, or a metal germanosilicide at a lower temperature than is necessary for formation of a metal-semiconductor alloy including a III-V compound semiconductor material or a II-VI compound semiconductor material. Thus, a lower temperature anneal process can be employed to provide metallization contacts to the source region 60S and the drain region 60D of the present disclosure compared with source and drain regions of the prior art devices, the device profile of the HEMT of the present disclosure can be well defined by reducing the anneal temperature.

Figure 11:
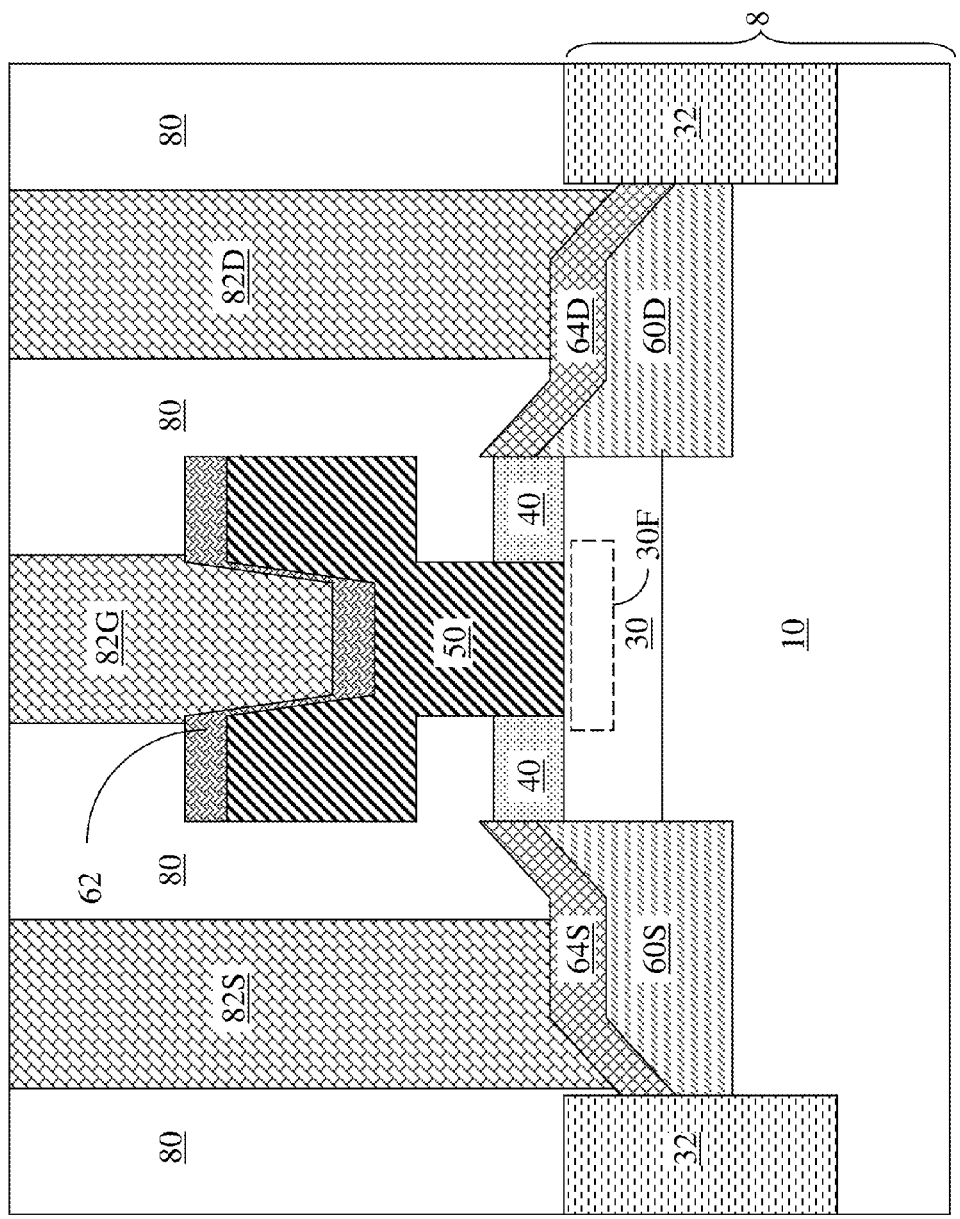
FIG. 11 is a vertical cross-sectional view of the first exemplary semiconductor structure after formation of a contact-level dielectric material layer and various contact structures therein according to the first embodiment of the present disclosure.

Referring to FIG. 11, a contact-level dielectric material layer 80 can be formed above the gate electrode contact structure 60G, the source region 60S, and the drain region 60D by depositing a dielectric material. The dielectric material of the contact-level dielectric material layer 80 can be, for example, silicon oxide, organosilicate glass (OSG), a spin-on glass (SOG), silicon nitride, or a combination thereof. The dielectric material of the contact-level dielectric material layer 80 can be deposited, for example, by chemical vapor deposition (CVD). Various contact structures can be formed through the contact-level dielectric material layer 80. The various contact structures can include, for example, a source-side contact via structure 82S that contacts the source region 60S, a drain-side contact via structure 82D that contacts the drain region 60D, and a gate-side contact via structure 82G that contacts the gate electrode contact structure 60G. The horizontal surface at which the gate electrode 50 contacts the top compound semiconductor layer 30 can be coplanar with the top surface of the top compound semiconductor layer 30.

Figure 12:
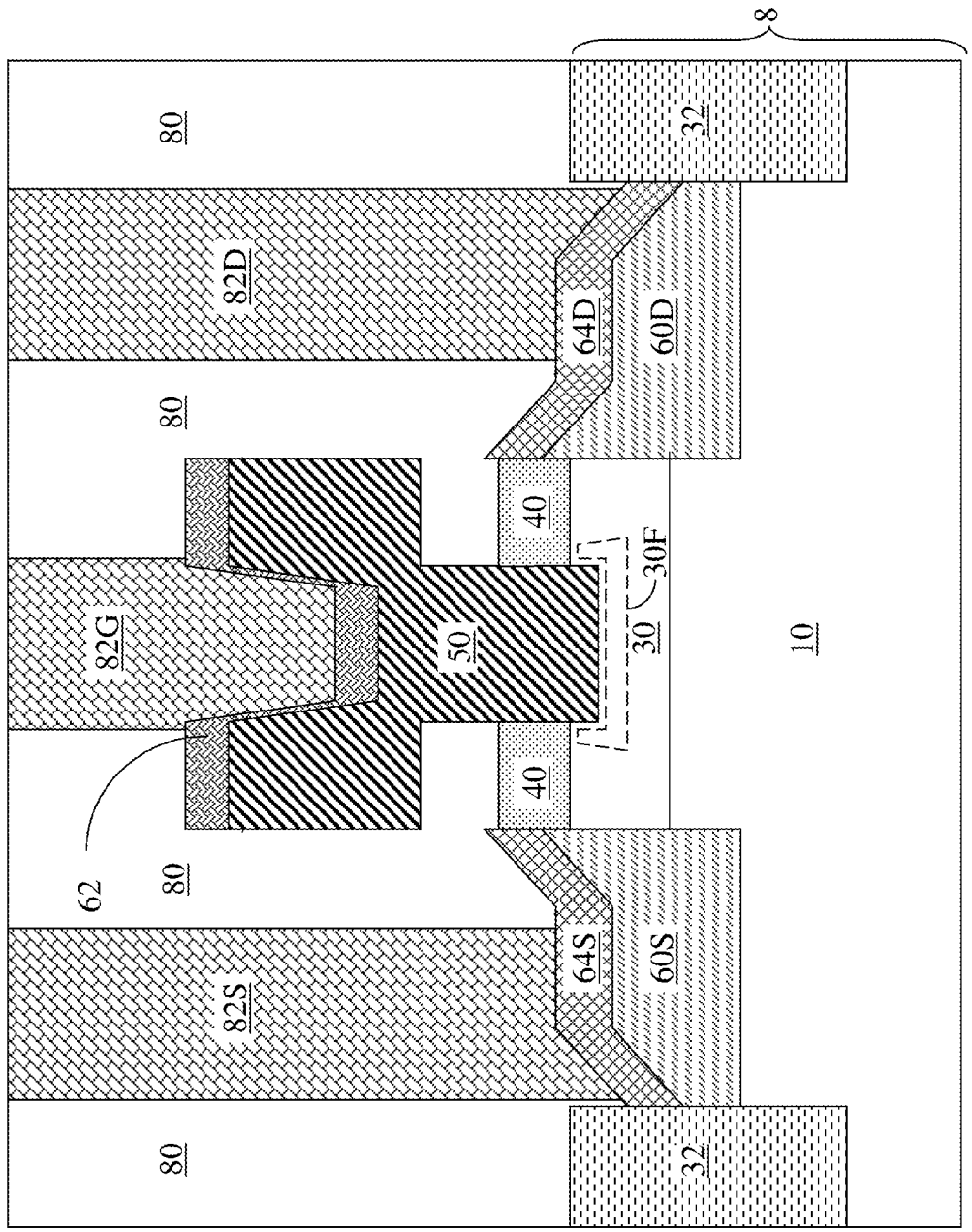
FIG. 12 is a vertical cross-sectional view of a variation of the first exemplary semiconductor structure according to the first embodiment of the present disclosure.

Referring to FIG. 12, a variation of the first exemplary semiconductor can be derived from the first exemplary semiconductor structure by altering the process for the anisotropic etch at the processing step of FIG. 4. The anisotropic etch that transfers the pattern in the insoluble first photoresist portion 42I through the dielectric material layer 40 is extended after the top surface of the top compound semiconductor layer 30 is physically exposed. The physically exposed surface of the top compound semiconductor layer 30 is recessed by the anisotropic etch such that a horizontal surface at the bottom of the cavity 42C' (See FIG. 4) is recessed to a depth between the top surface of the top compound semiconductor layer 30 and the bottom surface of the top compound semiconductor layer 30. A cavity 42C' that replicates the pattern of the first opening 42C (See FIG. 3) extends into the top compound semiconductor layer 30. The second opening 44C in the template material layer, i.e., the insoluble second photoresist portion 44I, can overlie the entirety of the cavity 42C'. The recessed surface of the top compound semiconductor layer 30 is physically exposed within the cavity 42C'.

Optionally, the anisotropic etch can employ a fluorine-including gas during the recessing of the horizontal surface of the top compound semiconductor layer 30. In this case, fluorine atoms in the plasma can be introduced into the top compound semiconductor layer 30 during the recessing of the second single crystalline compound semiconductor material, and can form a fluorine-doped region 30F. The fluorine-doped region 30F can be formed in a surface portion underneath the recessed horizontal surface of the top compound semiconductor layer 30. The fluorine-doped region 30F can have a thickness less than the thickness of the recessed portion of the top compound semiconductor layer 30, i.e., can be vertically spaced from the substrate compound semiconductor layer 10. In one embodiment the fluorine-doped region 30F can have a thickness in a range from 3 nm to 10 nm, although lesser and greater thicknesses can also be employed. The processing steps of FIGS. 5-10 are subsequently performed. In the variation of the first exemplary semiconductor structure, the horizontal surface within the interface between the gate electrode 50 and the top compound semiconductor layer 30 is recessed below the horizontal plane of the top surface of the top compound semiconductor layer 30.

Figure 13:
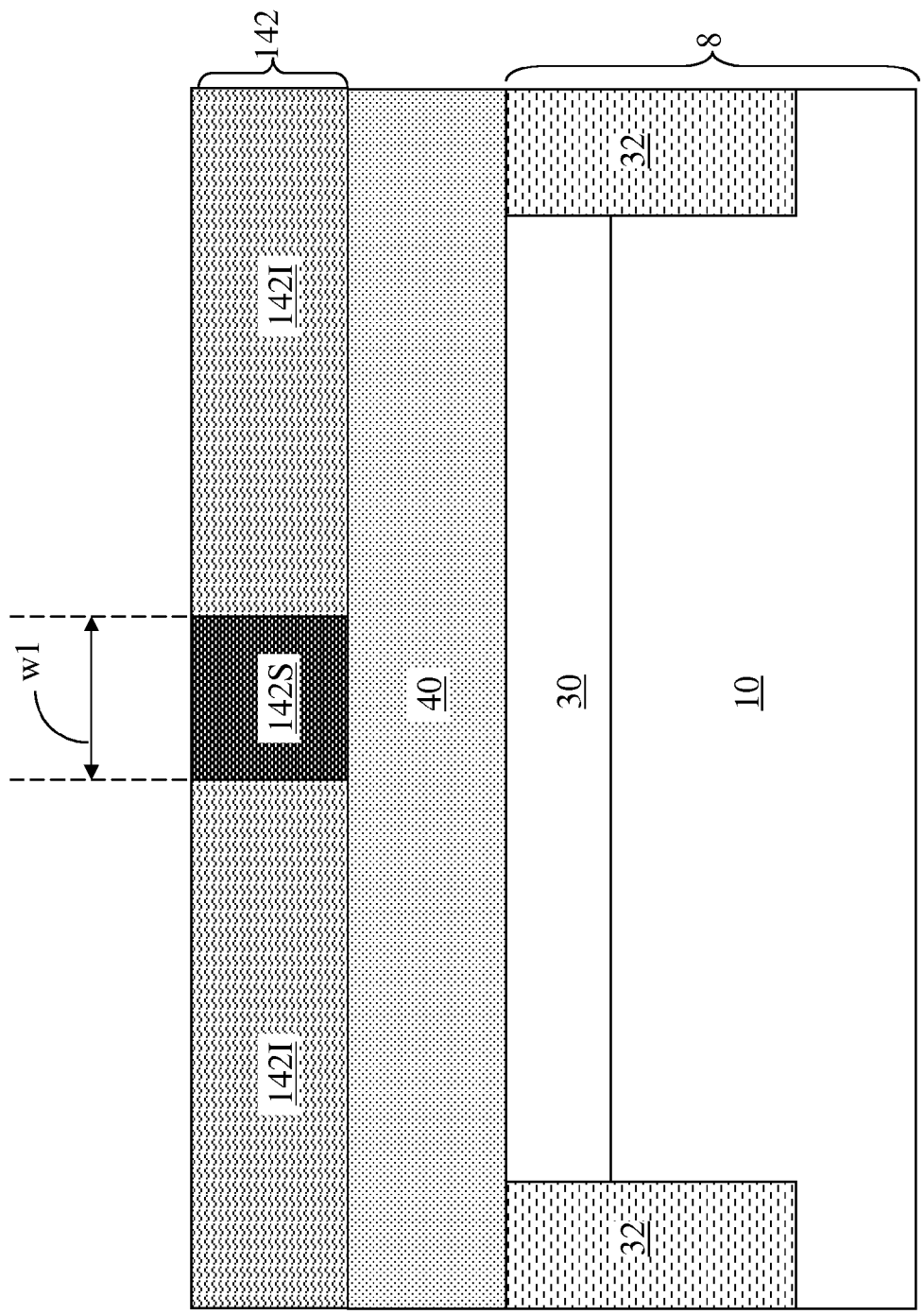
FIG. 13 is a vertical cross-sectional view of a second exemplary semiconductor structure after application and lithographic exposure of a first photoresist layer according to a second embodiment of the present disclosure.

Referring to FIG. 13, a second exemplary semiconductor structure according to a second embodiment of the present disclosure is derived by providing a substrate 8 as in the first exemplary semiconductor structure, optionally forming shallow trench isolation structures 32, and forming a dielectric material layer 40. The dielectric material layer 40 of the second embodiment can have the same composition as the dielectric material layer 40 of the first embodiment. The thickness of the dielectric material layer 40 of the second embodiment can be in a range of the sum of the first thickness t1 and the second thickness t2 of the first embodiment, i.e., in a range from 35 nm to 150 nm, although lesser and greater thicknesses can also be employed.

A first photoresist layer 142 can be applied over the dielectric material layer 40. The first photoresist layer 142 is lithographically exposed to form a soluble first photoresist portion 142S and an insoluble first photoresist portion 142I. In one embodiment, the soluble first photoresist portion 142S can have a uniform width that is invariant along a horizontal direction perpendicular to the plane of FIG. 13. This uniform width is herein referred to as a first width w1.

Figure 14:
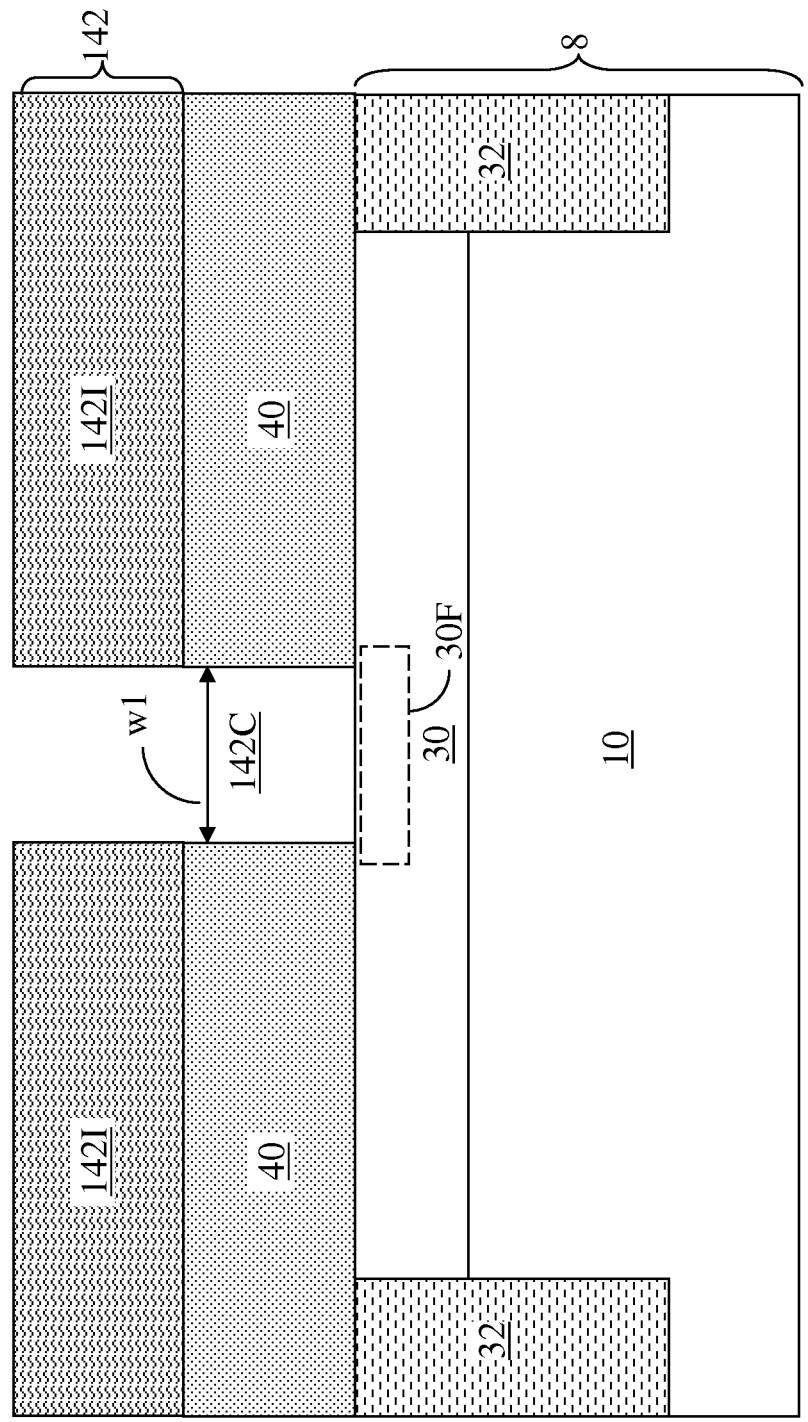
FIG. 14 is a vertical cross-sectional view of the second exemplary semiconductor structure after forming a hole in the dielectric material layer employing the first photoresist layer as an etch mask and optionally forming a fluorine-doped region according to the second embodiment of the present disclosure.

Referring to FIG. 14, the soluble first photoresist portion 142S can be removed, for example, by dissolving in a developer solution. A cavity 142C is formed in a volume from which the soluble first photoresist portion 142S is removed. The first cavity 142C can have the first width w1, and the second opening 44C can have the second width w2.

The pattern in the insoluble first photoresist portion 142I is transferred into the dielectric material layer 40 by an anisotropic etch. The anisotropic etch employs a remaining portion of the first photoresist layer 42, i.e., the insoluble first photoresist portion 142I, as an etch mask. The cavity 142C extends into the dielectric material layer 40.

Optionally, the anisotropic etch can employ a fluorine-including gas during the downward extension of the cavity 142C through the dielectric material layer 40. Further, the anisotropic etch can continue after the top surface of the top compound semiconductor layer 30 is physically exposed with a decreased plasma intensity. In this case, fluorine atoms in the plasma can be introduced into the top compound semiconductor layer 30 without significantly etching the second single crystalline compound semiconductor material, and can form a fluorine-doped region 30F. The fluorine-doped region 30F can be formed in a surface portion of the top compound semiconductor layer 30 directly underneath the cavity 142C in the dielectric material layer 40. The fluorine-doped region 30F can have a thickness less than the thickness of the top compound semiconductor layer 30, i.e., can be vertically spaced from the substrate compound semiconductor layer 10. In one embodiment the fluorine-doped region 30F can have a thickness in a range from 3 nm to 10 nm, although lesser and greater thicknesses can also be employed. The insoluble first photoresist portion 1421 can be subsequently removed, for example, by ashing or a solvent wash.

Figure 15:
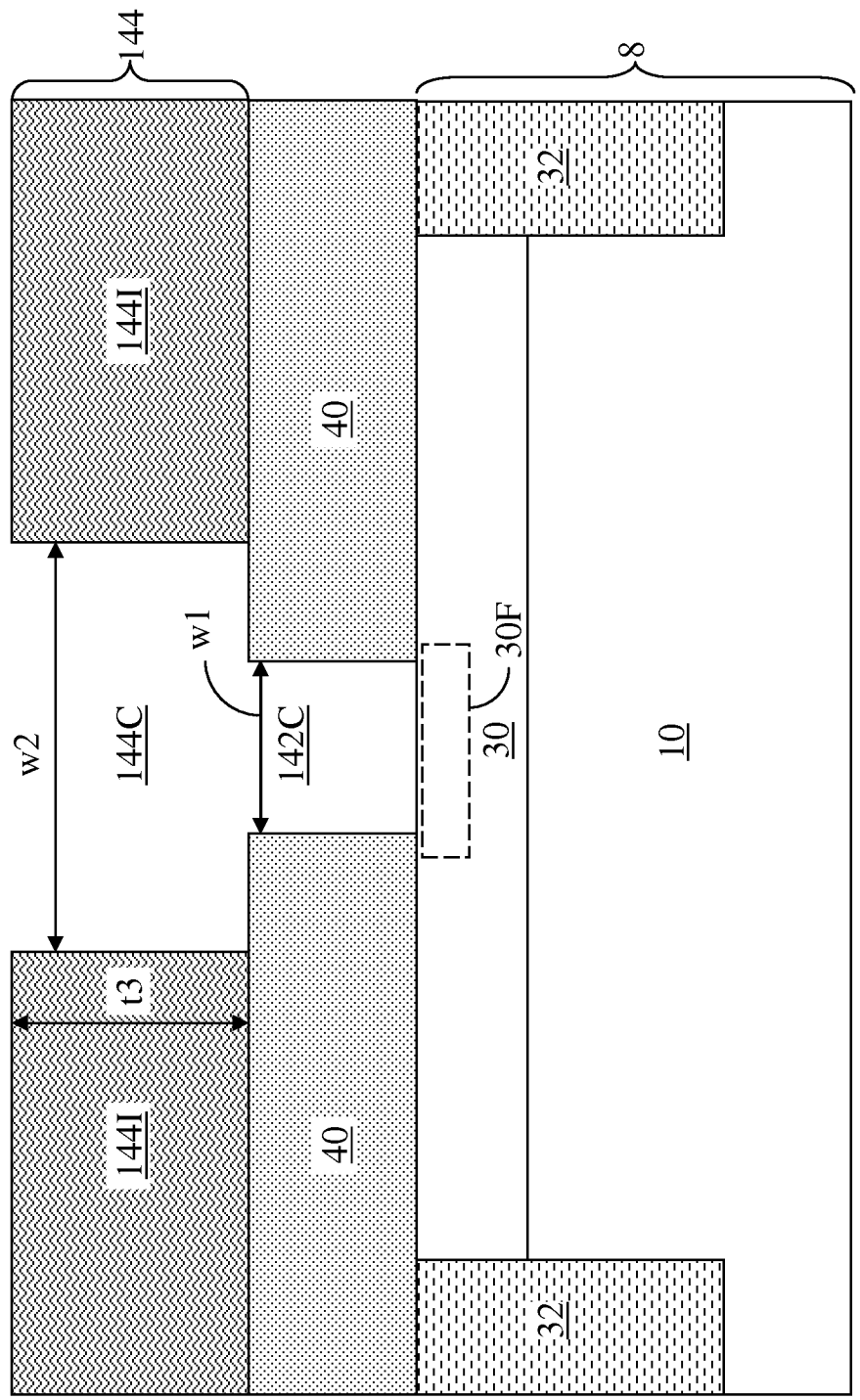
FIG. 15 is a vertical cross-sectional view of the second exemplary semiconductor structure after application and patterning of a second photoresist layer according to the second embodiment of the present disclosure.

Referring to FIG. 15, a second photoresist layer 144 can be applied over the dielectric material layer 40, and is patterned by lithographic exposure and development to form an opening 144C overlying the cavity 142C in the dielectric material layer 40. The thickness of the second photoresist layer 144 is herein referred to as a third thickness t3, which can have the same range as the third thickness t3 of the first embodiment. A remaining portion of the second photoresist layer 44 constitutes an insoluble second photoresist portion 441. In one embodiment, the opening 144C can have a uniform width that is invariant along a horizontal direction perpendicular to the plane of FIG. 15. This uniform width is herein referred to as a second width w2. The second width w2 is greater than the first width w1.

The insoluble second photoresist portion 1441 constitutes a template material layer including the opening 144C therein. The template material layer is formed over the dielectric material layer 40 after the transfer of the pattern in the insoluble first photoresist portion 1421 into the dielectric material layer 40. The opening 144C in the template material layer, i.e., the insoluble second photoresist portion 1441, can overlie the entirety of the cavity 142C. A portion of the top surface of the top compound semiconductor layer 30 is physically exposed within the cavity 142C.

Figure 16:
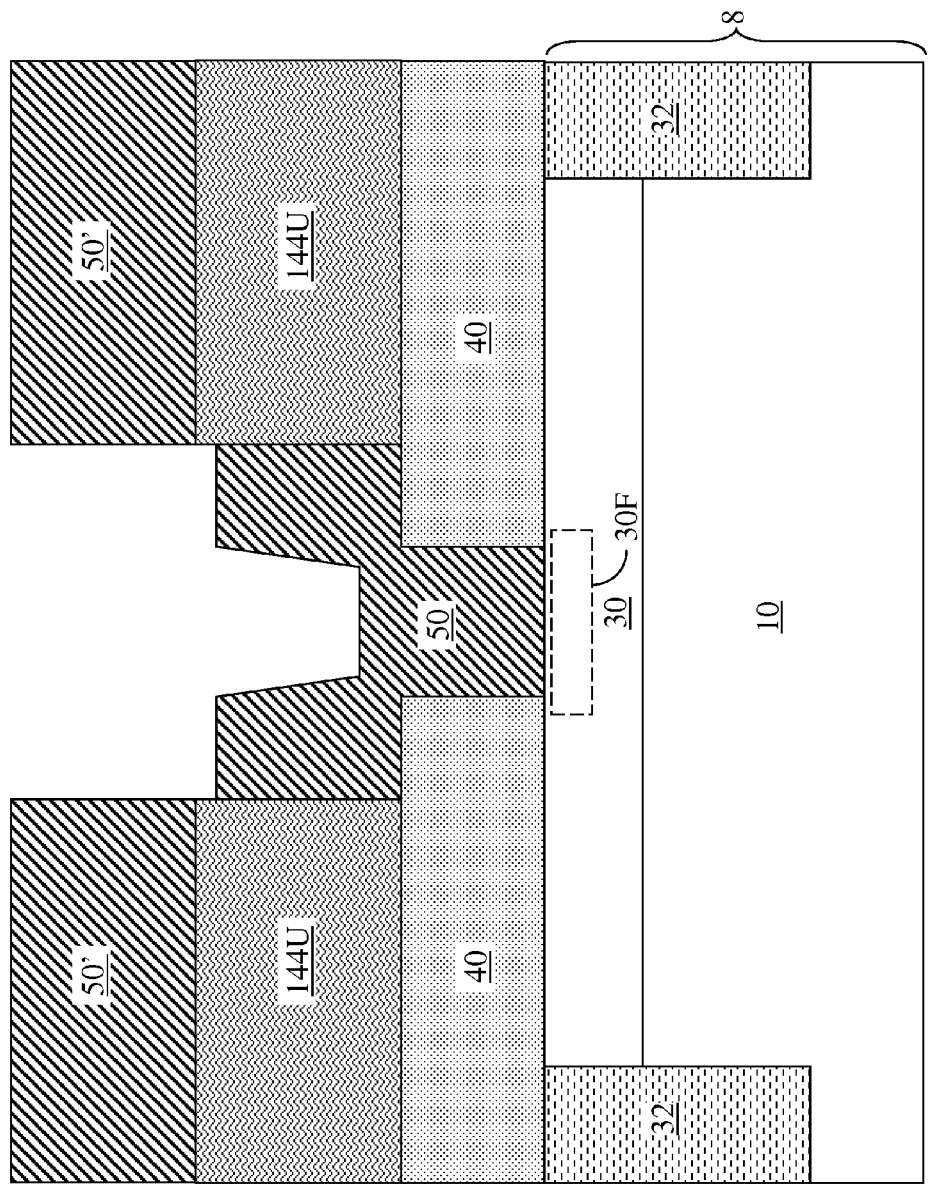
FIG. 16 is a vertical cross-sectional view of the second exemplary semiconductor structure after formation of a gate electrode by a directional deposition of at least one metallic material according to the second embodiment of the present disclosure.

Referring to FIG. 16, the processing steps of FIG. 5 can be performed in the same manner as in the first embodiment. Subsequently, the processing steps of FIG. 6 can be performed in the same manner as in the first embodiment. For example, the second photoresist layer 144 can be removed selective to the dielectric material layer 40 and the gate electrode 50 employing the same method as in the first embodiment. The conductive material portion 50' can be lifted off within the solvent as the second photoresist layer 144 is dissolved. The dielectric material layer 40 can be patterned by an anisotropic etch that employing the gate electrode 50 as an etch mask in the same manner as in the first embodiment.

Figure 17:
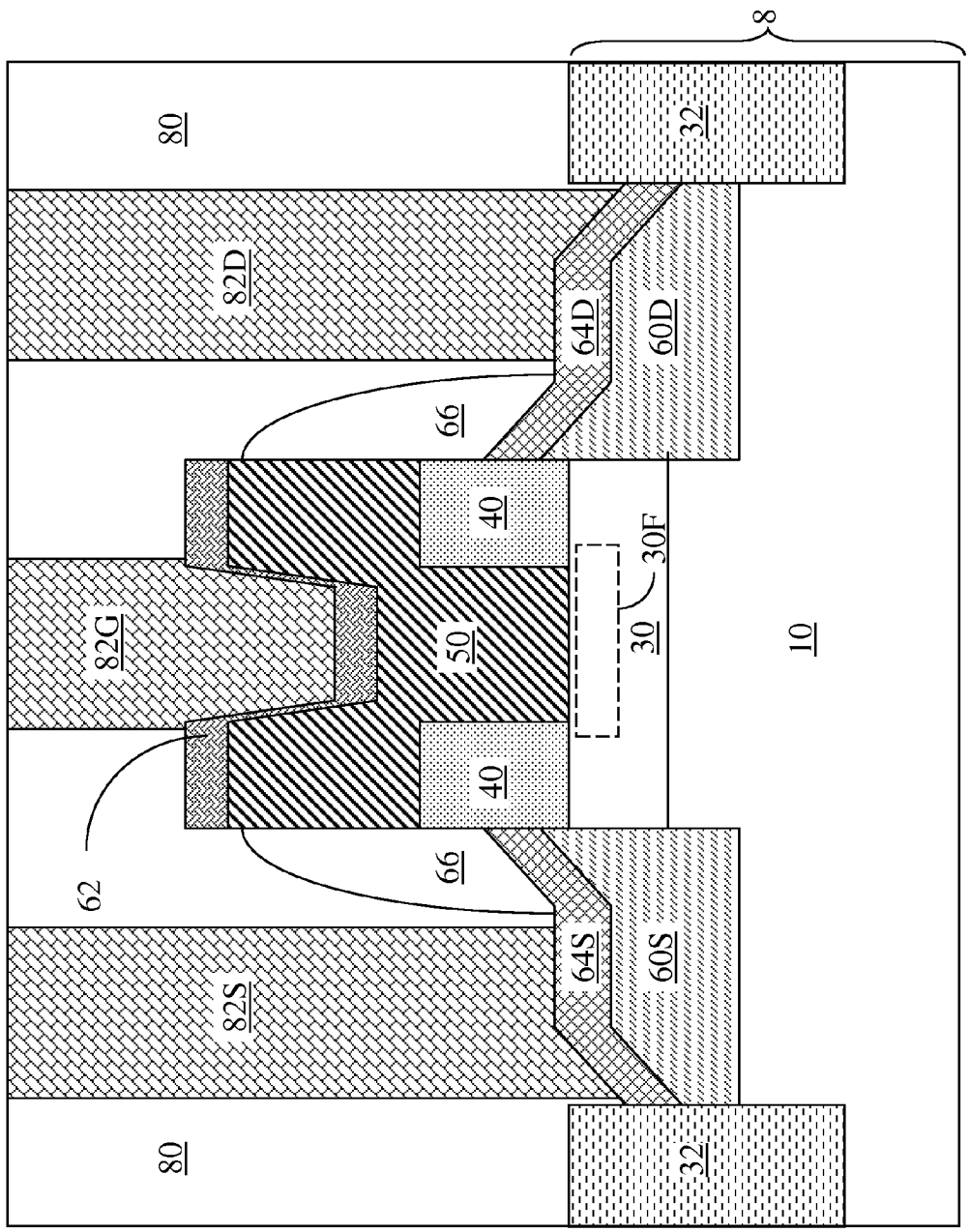
FIG. 17 is a vertical cross-sectional view of the second exemplary semiconductor structure after formation of a contact-level dielectric material layer and various contact structures therein according to the second embodiment of the present disclosure.

Referring to FIG. 17, the processing steps of FIG. 7 can be performed. After the patterning of the dielectric material layer 40, a first sidewall of the remaining portion of the dielectric material layer 40 can be vertically coincident with a first sidewall of the upper portion of the gate electrode 50, and a second sidewall of the remaining portion of the dielectric material layer 40 can be vertically coincident with a second sidewall of the upper portion of the gate electrode 50. The first sidewall of the upper portion of the gate electrode 50 and the first sidewall of the dielectric material layer 40 can be within a first vertical plane, and the second sidewall of the upper portion of the gate electrode 50 and the second sidewall of the dielectric material layer 40 can be within a second vertical plane.

Subsequently, the processing steps of FIGS. 8-11 can be performed in the same manner as in the first embodiment to provide the second exemplary semiconductor structure illustrated in FIG. 17.

Figure 18:
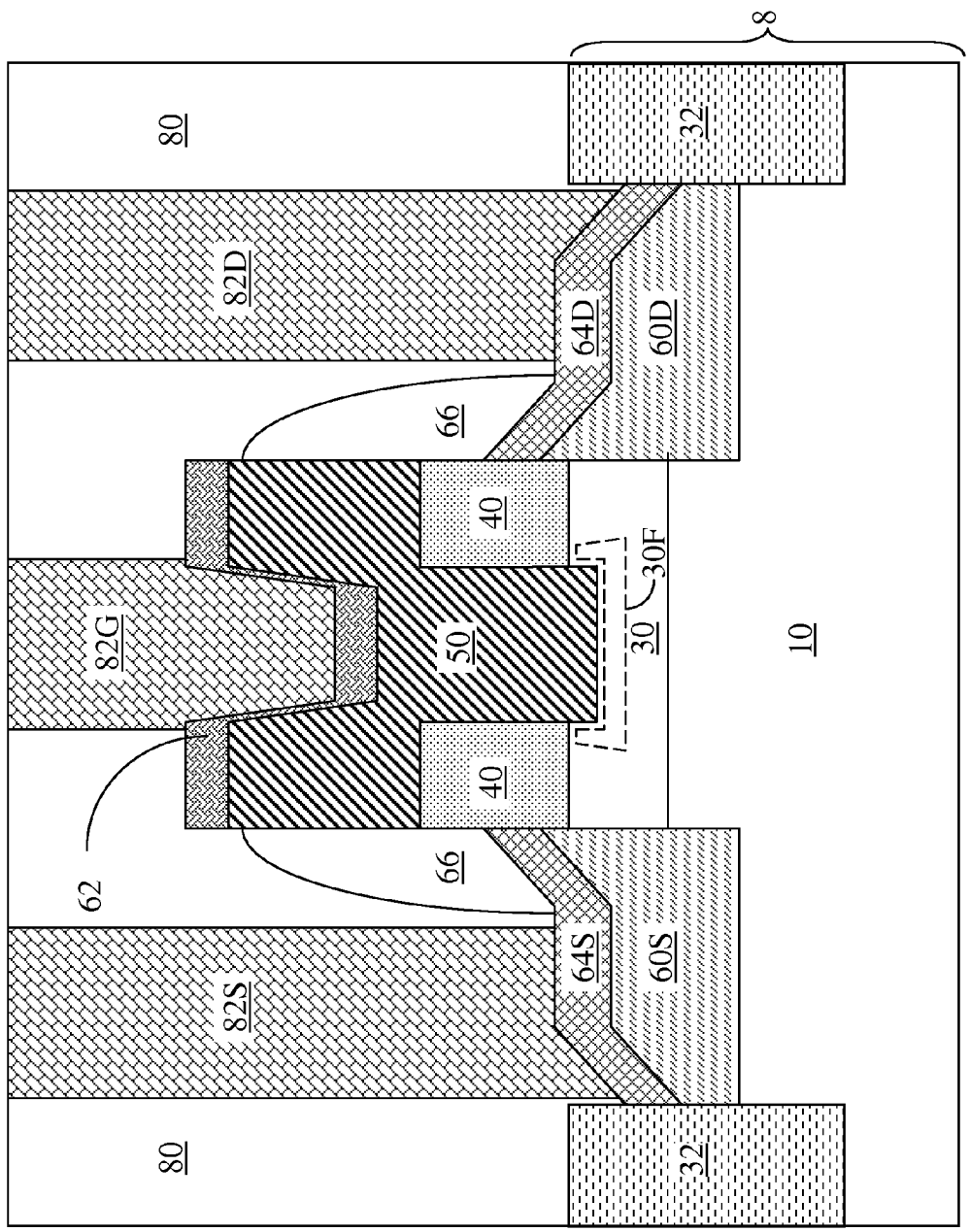
FIG. 18 is a vertical cross-sectional view of a variation of the second exemplary semiconductor structure according to the second embodiment of the present disclosure.

Referring to FIG. 18, a variation of the second exemplary semiconductor structure can be derived from the second exemplary semiconductor structure by performing the same variations to the processing sequence of the second embodiment as the variations to the processing steps of the first embodiment that are employed to form the variation of the first exemplary semiconductor structure illustrated in FIG. 12.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A semiconductor structure comprising a high electron mobility transistor (HEMT), wherein said HEMT comprises:
   a substrate comprising a stack, from bottom to top, of a substrate compound semiconductor layer and a top compound semiconductor layer;
   a gate electrode comprising a lower vertical portion having a bottommost surface contacting a topmost surface of said top compound semiconductor layer and an upper horizontal portion overlying said lower vertical portion and extending beyond sidewalls of said lower vertical portion;
   a source region embedded in a first portion of said substrate;
   a drain region embedded in a second portion of said substrate and laterally spaced from said source region, wherein said first portion is laterally spaced from said second portion by a width of said upper horizontal portion of said gate electrode, and wherein each of said source region and said drain region comprises at least one elemental semiconductor material; and
   a dielectric material layer laterally contacting said lower vertical portion of said gate electrode, wherein a first sidewall of said dielectric material layer is vertically coincident with a first sidewall of said upper horizontal portion of said gate electrode, and a second sidewall of said dielectric material layer is vertically coincident with a second sidewall of said upper horizontal portion of said gate electrode.

2. The semiconductor structure of claim 1, wherein said substrate compound semiconductor layer comprises a first single crystalline compound semiconductor material, and said top compound semiconductor layer comprises a second single crystalline compound semiconductor material having a greater charge carrier mobility than said first single crystalline compound semiconductor material.

3. The semiconductor structure of claim 2, wherein said source region and said drain region are single crystalline, and are epitaxially aligned to said second single crystalline compound semiconductor material and said first single crystalline compound semiconductor material.

4. The semiconductor structure of claim 2, wherein a bottom surface of said source region and a bottom surface of said drain region are in contact with said first single crystalline compound semiconductor material.

5. The semiconductor structure of claim 1, wherein each of said source region and said drain region consist essentially of said at least one semiconductor material, hydrogen atoms, and electrical dopant atoms.

6. The semiconductor structure of claim 1, wherein each of said source region and said drain region comprises a single crystalline or polycrystalline silicon material, a single crystalline or polycrystalline germanium material, or a single crystalline or polycrystalline alloy of silicon and germanium.

7. The semiconductor structure of claim 1, further comprising:
   a source-side metal-semiconductor alloy portion in contact with a top surface of said source region; and
   a drain-side metal-semiconductor alloy portion in contact with a top surface of said drain region.

8. The semiconductor structure of claim 7, wherein said gate electrode is a T-shaped gate electrode.

9. The semiconductor structure of claim 8, wherein a sidewall of said source region is vertically coincident with said first sidewall of said upper horizontal portion of said gate electrode, and a sidewall of said drain region is vertically coincident with said second sidewall of said upper horizontal portion of said gate electrode.

10. The semiconductor structure of claim 1, further comprising a fluorine-doped region located within said top compound semiconductor layer and underneath said gate electrode.

11. The semiconductor structure of claim 1, wherein said substrate compound semiconductor layer comprises gallium nitride and said top compound semiconductor layer comprises aluminum gallium nitride.

12. The semiconductor structure of claim 1, wherein a topmost surface of said substrate compound semiconductor layer is in direct contact with a bottommost surface of said top compound semiconductor layer.

13. The semiconductor structure of claim 7, wherein said source-side metal-semiconductor alloy portion is in direct contact with an entire top surface of said source region, and said drain-side metal-semiconductor alloy portion is in direct contact with an entire top surface of said drain region.

* * * * *